US006327556B1

(12) United States Patent
Geiger et al.

(10) Patent No.: US 6,327,556 B1
(45) Date of Patent: Dec. 4, 2001

(54) AT-SPEED COMPUTER MODEL TESTING METHODS

(75) Inventors: Thomas Kennith Geiger, Fremont; Larry Tzu-Chiao Chen, Hayward, both of CA (US)

(73) Assignee: Adaptec, Inc., Milpitas, CA (US)

( * ) Notice: Subject to any disclaimer, the term of this patent is extended or adjusted under 35 U.S.C. 154(b) by 0 days.

(21) Appl. No.: 09/238,387

(22) Filed: Jan. 27, 1999

Related U.S. Application Data
(60) Provisional application No. 60/075,631, filed on Feb. 21, 1998.

(51) Int. Cl.⁷ ...................................................... G06F 17/50
(52) U.S. Cl. .................................. 703/13; 703/14; 716/4; 702/117; 714/738
(58) Field of Search .................................. 703/13–15, 22; 702/117; 716/2, 4; 714/738, 739

(56) References Cited

U.S. PATENT DOCUMENTS

| 5,535,223 | 7/1996 | Horstmann et al. .................... 371/27 |
| 5,586,046 | * 12/1996 | Feldbaumer et al. ................... 703/13 |
| 5,684,808 | 11/1997 | Valind .................................. 371/22.3 |
| 5,696,772 | 12/1997 | Lesmeister ............................. 371/27 |
| 5,974,241 | 10/1999 | Fusco .............................. 395/500.03 |

(List continued on next page.)

OTHER PUBLICATIONS

Huston, R.E., "Pin Margin Analysis", Proceedings International Test Conference, pp. 655–662, Nov. 1997.*
Sakashita et al., "A Built–In Self–Test Circuit with Timing and Margin Test Function in a 1 Gbit Synchronous DRAM", Proceedings International Test Conference, pp. 319–324, Oct. 1996.*

Kamon et al., "Interconnect Parasitic Extraction in the Digital IC Design Methodology", Digest of Technical Papers IEEE/ACM International Conference on Computer Aided Design, pp. 223–230, Nov. 1999.*
Chakraborty, T.J.; Agrawal, V.D., "Simulation of at–speed tests for stuck–at–faults", Proceedings 13th IEEE VLSI Test Symposium, 1995. pp. 216–220.*
Beker et al. "Extraction of Parasitic Circuit Elements in a PEBB for Application in the Virtual Test Bed", IEEE Industry Applications Conference, vol. 2, pp. 1217–1221, Oct. 1997.*
S. Westfall, "Memory Test—Debugging Test Vectors Without ATE", Nov. 1997, pp. 663–669, IEEE, International Test Conf., TSSI Div., Summit Design, Inc., Beaverton, OR.
C.E. Cummings, "Generating ASIC test vectors with Verilog", Jul. 1994, pp. 63–70, IEEE, Tektronix, Inc., Beaverton, OR.

(List continued on next page.)

Primary Examiner—Kevin J. Teska
Assistant Examiner—Douglas V. Sergent
(74) Attorney, Agent, or Firm—Martine & Penilla, LLP

(57) ABSTRACT

A computer implemented method for performing testing of a computer model of an integrated circuit design is disclosed. The method includes initially generating a first AVF test file for a first integrated circuit design having slow characteristics. Then, the method proceeds to generate a second AVF test file for a second integrated circuit design having fast characteristics. Once the two AVF test files are generated, the method proceeds to comparing test file parameters from the first AVF test file and the second AVF test file. Based on the comparisons, the method proceeds to generate a modified AVF test file that replaces miscompares (i.e., cycle slips) between output signals of the first and second AVF test files with don't care values. The method also includes options for performing pin margining. The pin margining operations are configured to make modifications to the AVF test files in order to compensate for expected physical test station adjustments.

22 Claims, 29 Drawing Sheets

U.S. PATENT DOCUMENTS

| | | | | |
|---|---|---|---|---|
| 5,974,248 | * | 10/1999 | Graef | 703/22 |
| 5,983,381 | * | 11/1999 | Chakradhar et al. | 714/738 |
| 5,995,740 | | 11/1999 | Johnson | 395/500.41 |
| 6,047,247 | * | 4/2000 | Iwanishi et al. | 702/117 |

OTHER PUBLICATIONS

R. Ho, C. Yang, M. Horowitz and D. Dill, "Architecture Validation for Processors", Jun. 1995, pp. 404–413, IEEE, Computer Systems Laboratory, Stanford University, Stanford, CA.

* cited by examiner

| AVF GENERATOR DEFINITIONS ||
|---|---|
| (command line input) >avfgen <-v> <-p> <-m filename>   <-o filename> <-n filename> <-t top> < top_instance> <-i> ||
| -v | Enable verbose option for debugging *OPTIONAL* |
| -p | Do not make place holders for power pin s *OPTIONAL* |
| -o filename | Output filename |
| -m filename | Load map file or multi port io cells where filename is the name for the pin to port mapping file. *OPTIONAL* |
| -n filename | Filename of netlist to parse |
| -t top instance | Name of top level modul e followed by instantiation name of top level module |
| -i iopad instance | Name of iopad module |
| -r reset_pin# | Pin number of power on reset Instantiation name of iopad module |

FIG. 4A

| COMMAND LINE ENTRY |
|---|
| > avfgen -v -p -Ochip_avf.v -m chip.map -n top.opus.vs -t u_top -i u_iopad -r 38 |

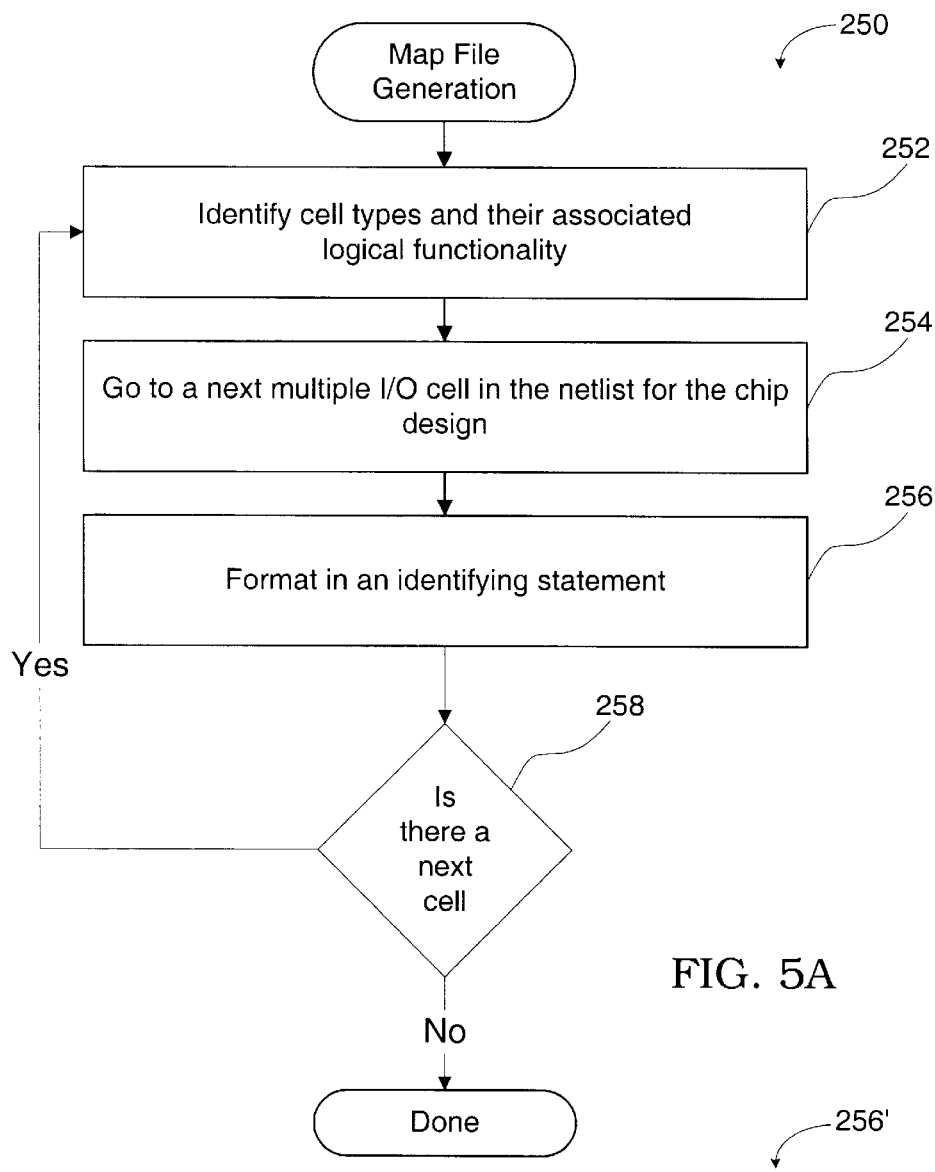
FIG. 5A
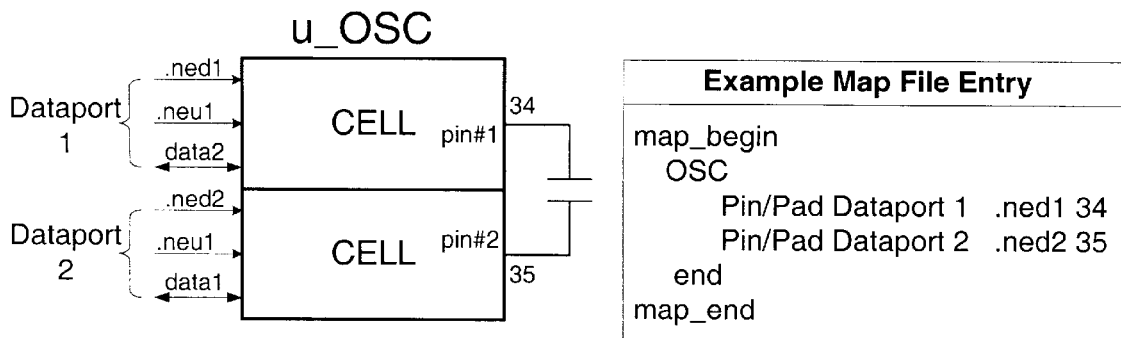
FIG. 5B
FIG. 5C

302'

| EXAMPLE PORT/NET TABLE ||||
|---|---|---|---|
| Instance | Cell Type | Port   Net | Port   Net |
| : | : | : ||
| PAD001 | IO Cell 1 | .neu 1 (Signal 1) | .ned 1 (Signal 2) |
| PAD002 | IO Cell 2 | .neu 1 (Signal 1) | .ned 1 (Signal 2) |
| PAD003 | IO Cell 3 | .neu 1 (Signal 1) | .ned 1 (Signal 2) |
| PAD004 | IO Cell 1 | .neu 1 (Signal 1) | .ned 1 (Signal 2) |
| PAD005-21 (multi-pin) | SCSI Cell 1 | .neu 1 (Signal 1) | .ned 1 (Signal 2) |
| PAD34-35 (multi-pin) | OSC Cell | .ned 1 (Signal 1)<br>.ned 2 (Signal 3) | .neu 1 (Signal 2)<br>.neu 2 (Signal 4) |
| : | : | : ||

| AVF DATA CONVERSION Truth Table | | | |
|---|---|---|---|
| *Power On Reset* | *Output Enable* | *Value* | *AVF Data Output* |
| 1 | in | 1 | 1 |
| 1 | in | 0 | 0 |
| 1 | out | 1 | H |
| 1 | out | 0 | L |
| 0 | Don't Care | Don't Care | X |

FIG. 7B

EXEMPLARY STATEMENT TIMING CALCULATION

```
integer  hd0_time;                      initial  hd0_width = 0;
integer  hd0_totalchange;               initial  hd0_delay = 0;
integer  hd0_cyclechange;               initial  hd0_tgtype = 0;
integer  hd0_maxchange;                 initial  hd0_counter = 0;
integer  hd0_minchange;                 initial  hd0_totalchange = 0;
integer  hd0_ave;                       initial  hd0_cyclechange = 0;
integer  hd0_num;                       initial  hd0_maxchange = 0;
integer  hd0_width;                     initial  hd0_minchange = 0;
integer  hd0_delay;                     initial  hd0_num = 0;
integer  hd0_tgtype;                    initial  hd0_ave = 0;
integer  hd0_counter;
reg      hd0_strobed;

always @ (avfcycle)
 begin
   if ( (hd0_cyclechange = = 2) & (hd0_counter = = 10) )
     begin
       if (hd0_strobed)
         hd0_tgtype = 1;
       else
         hd0_tgtype = 2;
       $fdisplay (avflogfile, "WARNING: hd[0] has changed twice in 10 different
       $fdisplay (avflogfile, "WARNING: hd[0] is assuming a R%0d with delay = %
     end
   else if (hd0_counter < 10)
     hd0_delay < = 0;
   if (hd0_cyclechange = = 2)
     hd0_counter = hd0_counter +1;
   hd0_cyclechange = 0;
 end
always @ (test.u_top.hd[0] )
 if (hd0_cyclechange < 2)
   hd0_strobed < = test.u_top.hd[0];
always @ (test.u_top.hd[0] )
 if (hd0_oen)
  begin
   hd0_time = $time - cycle_start;
   hd0_totalchange = hd0_totalchange + 1;
   hd0_num = hd0_num + hd0_time;
   hd0_cyclechange = hd0_cyclechange + 1;
   if (hd0_cyclechange > 1) $ (hd0_counter < 10) )
     $fdisplay (avflogfile, "WARNING: hd[0] changes more than once in cycle %0d
   if (hd0_time > hd0_maxchange)
     hd0_maxchange = hd0_time;
   if (hd0_time < hd0_minchange)
     hd0_minchange = hd0_time;
   if ( (hd0_cyclechange = = 1) & (hd0_tgtype = = 0) )
     hd0_delay = hd0_time;
   if ( (hd0_cyclechange = = 2) & (hd0_tgtype = = 0) )
     hd0_wdith = hd0_time - hd0_delay;
   if (avfclk)
     $fdisplay (avflogfile, "WARNING: hd[0] changes after strobe in cycle %0d",
   else
     if (hd0_totalchange = = 0)
       hd0_ave = 0;
     else
       hd0_ave = hd0_num / hd0_totalchange;
  end
```

FIG. 8B

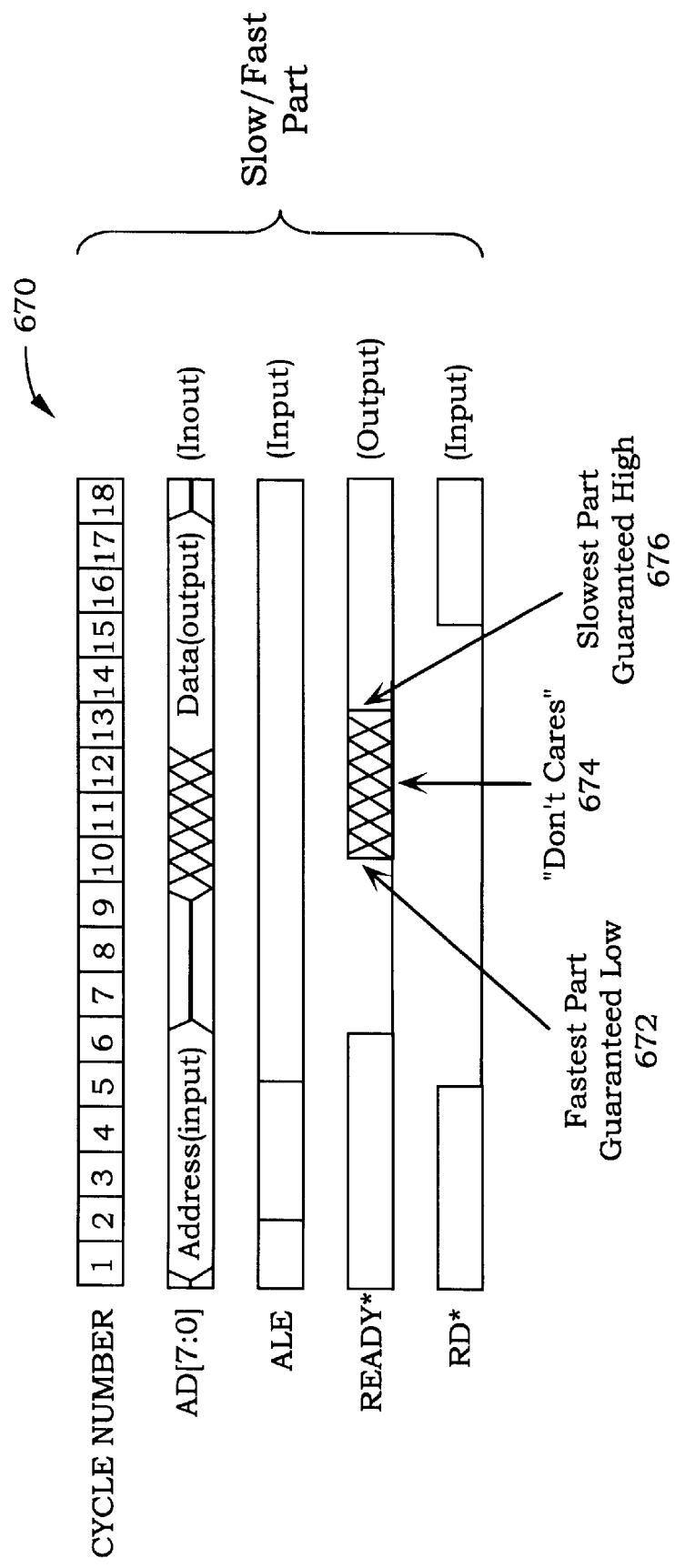

AT-SPEED COMPUTER MODEL TESTING METHODS

CROSS REFERENCE TO RELATED APPLICATIONS

This application claims the benefit of U.S. Provisional Patent Application having Ser. No. 60/075,631, filed on Feb. 21, 1998, entitled "Automated Test Vector Generation and Verification." This application also claims 35 U.S.C. § 120 priority of: (1) U.S. patent application Ser. No. 09/160,553, filed on Sept. 24, 1998, entitled "Automated Test Vector Generation and Verification"; and (2) U.S. patent application Ser. No. 09/236,957, filed on Jan. 25, 1999, and entitled "Automated Alternating Current Characterization Testing." These applications are hereby incorporated by reference.

BACKGROUND OF THE INVENTION

1. Field of the Invention

This invention relates generally to integrated circuits, and more particularly to methods for performing computer model at-speed testing of integrated circuit designs.

2. Description of the Related Art

Testing integrated circuits that are ultimately fabricated onto silicon chips has over the years increased in complexity as the demand has grown, and continues to grow for faster and more densely integrated silicon chips. In an effort to automate the design and fabrication of circuit designs, designers commonly implement hardware descriptive languages (HDL), such as Verilog, to functionally define the characteristics of the design. The Verilog code is then capable of being synthesized in order to generate what is known as a "netlist." A netlist is essentially a list of "nets," which specify components (know as "cells") and their interconnections which are designed to meet a circuit design's performance constraints. The "netlist" therefore defines the connectivity between pins of the various cells of an integrated circuit design. To fabricate the silicon version of the design, well known "place and route" software tools that make use of the netlist data to design the physical layout, including transistor locations and interconnect wiring.

When testing of the digital model, various test vectors are designed in order to test the integrated circuit's response under custom stimulation. For example, if the integrated circuit is a SCSI host adapter chip, the test vectors will simulate the response of the SCSI host adapter chip as if it were actually connected to a host computer and some kind of peripheral device were connected to the chip. In a typical test environment, a test bench that includes a multitude of different tests are used to complete a thorough testing of the chip. However, running the test vectors of the test bench will only ensure that the computer simulated model of the chip design will work, and not the actual physical chip in its silicon form.

To test a silicon chip 12 after it has been packaged, it is inserted into a loadboard 14 that is part of a test station 10, which is shown in FIG. 1A. Although the model of the chip design was already tested using the test vectors of the test bench, these test vectors are not capable of being implemented in the test station 10 without substantial modifications, to take into account the differences between a "model" and a "physical" design. In the prior art, the conversion of a test model test vector into test vectors that can actually be run on the test station 10 required a very laborious process that was unfortunately prone to computer computational errors as well as human errors. Of course, if any type of error is introduced during the generation of the test vectors that will ultimately be run on the silicon chip 12, the testing results generated by the test station 10 would indicate that errors exist with the part, when in fact, the part functions properly. This predicament is of course quite costly, because fabrication plants would necessarily have to postpone release of a chip until the test station indicated that the part worked as intended.

As mentioned above, the prior art test vector generation methodology was quite laborious, which in many circumstances was exacerbated by the complexity of the tests and size of the chip being tested. The methodology required having a test engineer manually type up the commands necessary to subsequently generate a "print-on-change" file once executed using Verilog. Defining the commands for generating the print-on-change file includes, for example, typing in the output enable information for each pin, defining pin wires, setting up special over-rides for power-on reset pins, etc. At this point, the print-on-change file would then be generated using a Verilog program, which in turn uses the commands generated by the test engineer.

In addition to manually producing these commands, a separate parameter file having timing information is separately produced in a manual typing-in fashion by the engineer. The generated print-on-change file and the parameter file are then processed by a program that is configured to produce a test file, which is commonly referred to as an AVF file. However, the production of the AVF is very computationally intensive because the generated print-on-change file can be quite large. The size of the print-on-change file grows to very large sizes because every time a pin in the design changes states, a line of the print-on-change file is dumped. Thus, the more pins in the design, more CPU time is required to convert the print-on-change file into a usable AVF file. In some cases where the test is very large or complex, the host computer processing the print-on-change file is known to crash or in some cases lock-up due to the shear voluminous amount of data.

Unfortunately, as mentioned above, the generated AVF file may have defects, such as timing errors, which may translate into errors being reported by the test station 10. The problem here is that the test station 10 will stimulate the part differently than the stimulation designed for the digital version. This problem therefore presents a very time consuming test and re-test of the part by the test station 10. When re-testing is performed, many modifications to the parameter file, containing timing information, are performed in an effort to debug errors with the AVF file. Although some parts are in fact defective in some way, the test engineer is still commonly required to re-run the tests to determine whether the errors are due to a defective AVF file or the physical device.

Furthermore, most conventional testing techniques require that the physical part actually be placed into the physical test station. At that time, the physical test station only allow test engineers to test parts at speeds that are a fraction of the true operating speeds of the integrated circuit design part. As a result, many times integrated circuit designs that are believed to work properly under test conditions will fail once they are exposed to their true functional operating speeds. This of course increases the cost of developing, testing, re-testing, and redesign of integrated circuit devices.

In view of the foregoing, there is a need for methods and computer readable media for testing integrated circuit designs via a computer model that enables testing at speeds that resemble actual functional operating speeds in order to reduce testing uncertainties, customer returns, and thereby increase customer satisfaction.

SUMMARY OF THE INVENTION

Broadly speaking, the present invention fills these needs by providing techniques for testing integrated circuit design computer models at speeds that resemble those of normal operating physical integrated circuit designs. The present invention further discloses test vector conversion techniques that take into account temperature and silicon variations which lead to variations in operating speeds. The converted test vectors are thus capable of being run on both integrated circuit design models having slow speed characteristics and those having fast speed characteristics without producing erroneous test data. It should be appreciated that the present invention can be implemented in numerous ways, including as a process, an apparatus, a system, a device, a method, or a computer readable medium. Several inventive embodiments of the present invention are described below.

In one embodiment, a computer implemented method for performing testing of a computer model of an integrated circuit design is disclosed. The method includes generating a first AVF test file for a first integrated circuit design having slow characteristics and generating a second AVF test file for a second integrated circuit design having fast characteristics. The method then proceeds to comparing test file parameters from the first AVF test file and the second AVF test file. After the comparing, the method moves to generating a modified AVF test file that takes into account the comparing of the test file parameters from the first test file and the second test file. The modified AVF test file is therefore suitable for running on both the first integrated circuit design and the second integrated circuit design.

In another embodiment, a computer implemented method for performing pin margin testing of a computer model of an integrated circuit design that is tested on a computer model of a physical tester is disclosed. The method includes: (a) performing pin margin testing on a first integrated circuit design having slow characteristics and a second integrated circuit design having fast characteristics; (b) recording miscompares detected during the pin margin testing of the first integrated circuit design and the second integrated circuit design; (c) applying strobe timing variations to the computer model of the physical tester; (d) recording miscompares detected during the applying of the strobe timing variations; (e) generating a plan file that contains instructions on how to fix miscompares detected during the pin margin testing and the strobe timing variations; and (f) running a post processor in a plan mode that is configured to generate a pin margining correct AVF test file. Once the post processor is run in plan mode, a verification run of the pin margining corrected AVF test file is run in order to find any additional miscompares.

In yet another embodiment, a computer readable media containing program instructions for performing testing of a computer model of an integrated circuit design is disclosed. The computer readable media includes: (a) program instructions for generating a first AVF test file for a first integrated circuit design having slow characteristics; (b) program instructions for generating a second AVF test file for a second integrated circuit design having fast characteristics; (c) program instructions for comparing test file parameters from the first AVF test file and the second AVF test file; and (d) program instructions for generating a modified AVF test file that takes into account the comparing of the test file parameters from the first test file and the second test file.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 4A illustrate example AVF generator commands in accordance with one embodiment of the present invention.

FIG. 5A illustrates a flowchart defining the method operations performed in generating a map file for a particular chip design in accordance with one embodiment of the present invention.

FIGS. 5B and 5C illustrate an example of a multiple I/O port cell and a map file entry in accordance with one embodiment of the present invention.

FIGS. 6B through 6D illustrate tables that are implemented during the generation of the AVF file and DUT file data in accordance with one embodiment of the present invention.

FIG. 7B illustrates an example of an AVF data conversion truth table, in accordance with one embodiment of the present invention.

FIG. 8B is a table illustrating an exemplary statement timing calculation in accordance with one embodiment of the present invention.

FIG. 14C illustrates an speed-corrected modified AVF test file after the comparison operations were performed to generate the changes to the output signals, in accordance with one embodiment of the present invention.

DETAILED DESCRIPTION OF THE PREFERRED EMBODIMENTS

An invention for testing integrated circuit design computer models at speeds that resemble those of normal operation of the physical integrated circuit design, before testing is performed on the actual physical integrated circuit design. The present invention also discloses test vector conversion techniques that take into account temperature and silicon variations which lead to variations in operating speeds. The converted test vectors are thus capable of being run on both integrated circuit design models having slow speed characteristics and those having fast speed characteristics without producing erroneous test data. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1:
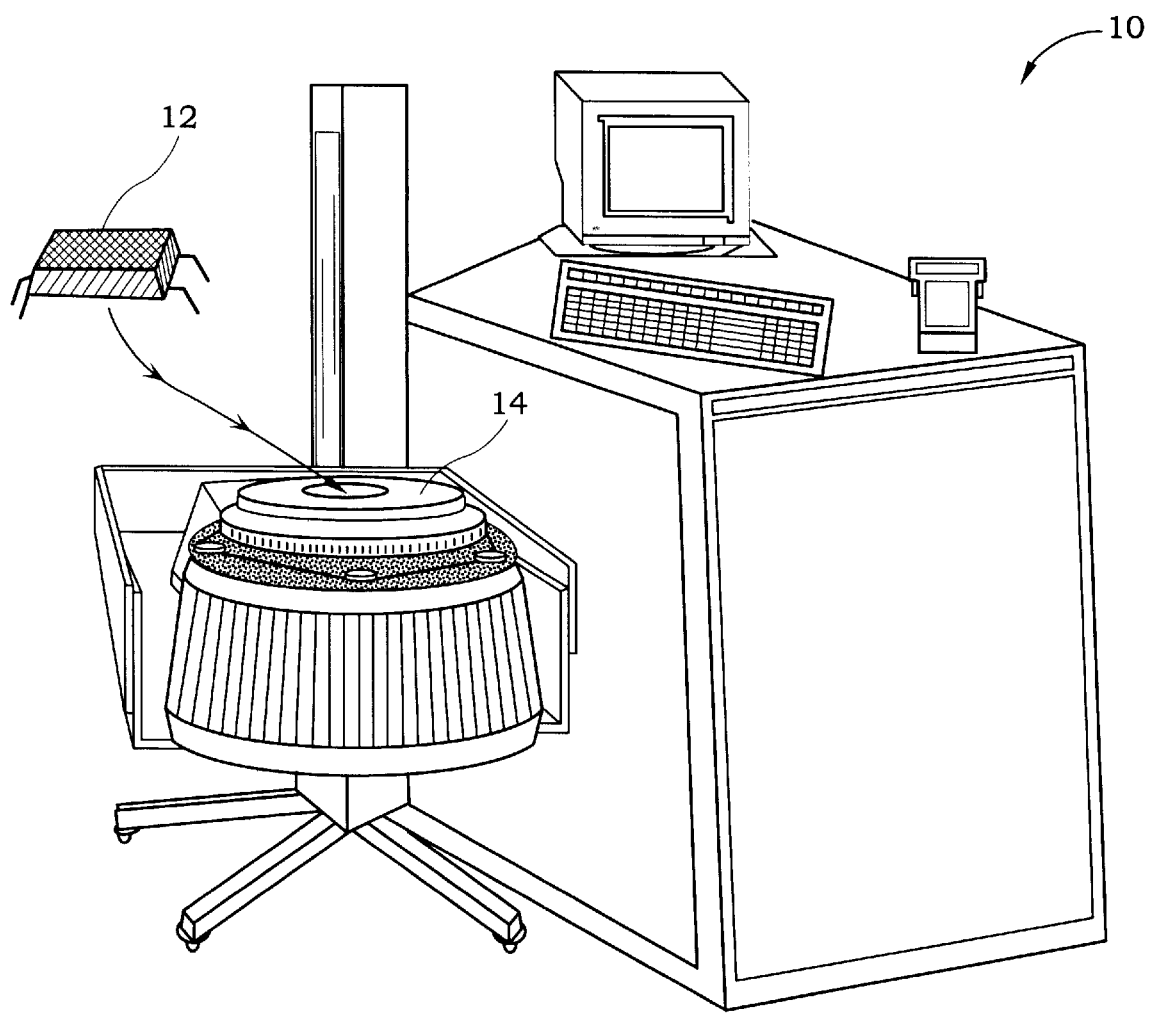
FIG. 1 illustrates a test station that is typically used in testing physical silicon integrated circuit devices.

As discussed above, FIG. 1 illustrates a test station 10 that is typically used in testing integrated circuit devices. The test station 10 typically includes a computer station which is coupled to a unit that has a loadboard 14. The loadboard 14, as is well known in the art, is used to receive integrated circuit devices 12. By the time testing is performed on the test station 10, the integrated circuit device 12 will be in a packaged form and has the proper package pins that will communicate with appropriate electrical receptacles on the load board 14. The following description will therefore detail the computer process implemented in automating the generation of test vectors and the automated verification of the test vectors before they are transferred to the test station 10 for use in testing the packaged circuit device 12. Section A will therefore describe the automated generation of the AVF file data and DUT timing file data (e.g., that includes the execution of avfgen and avf.v), and section B will describe the automated verification loop (e.g., that includes the execution of avf2vlg) that is executed to verify the generated AVF file data.

A. Automated AVF and DUT Data Generation

Figure 2:
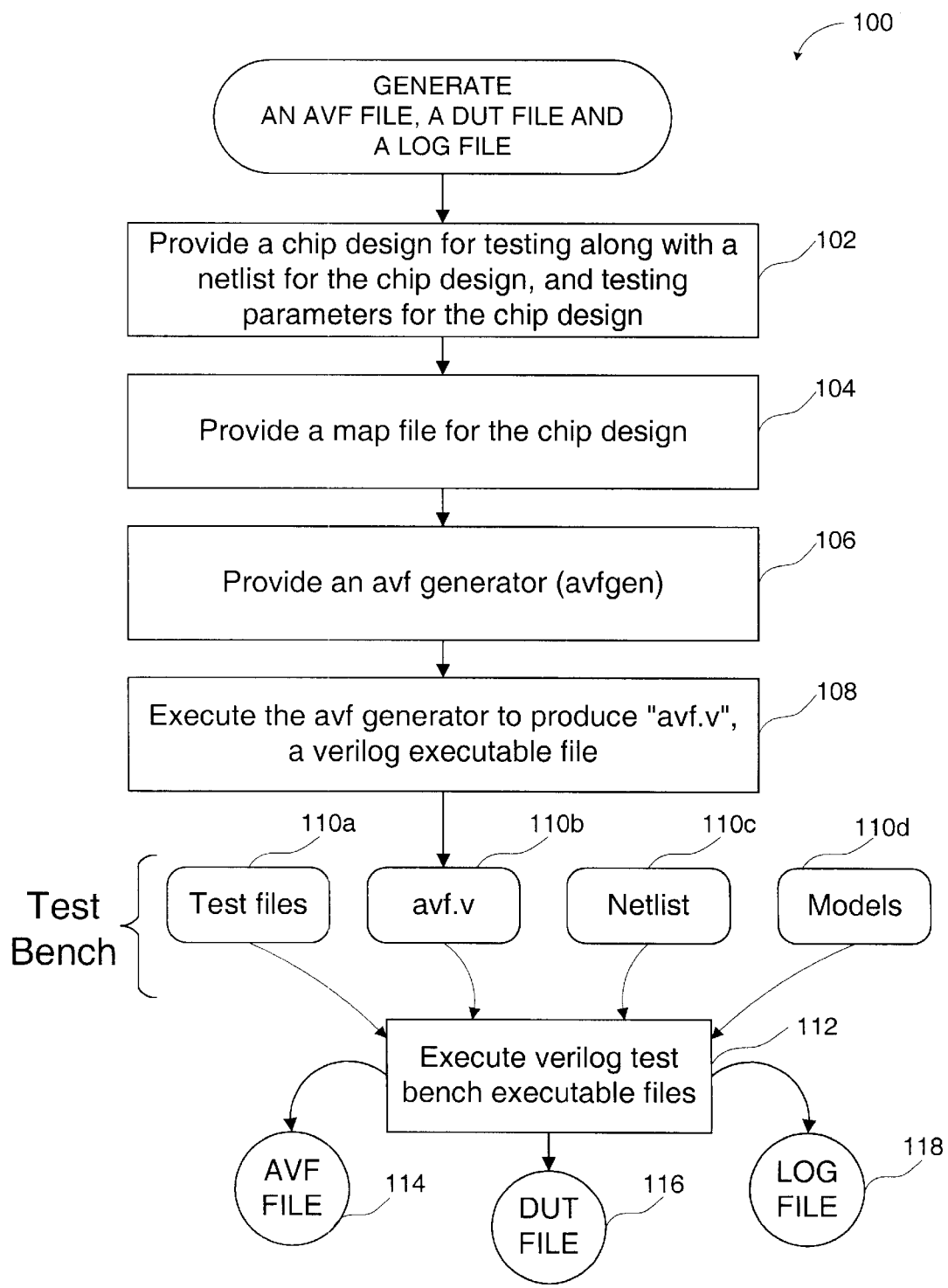
FIG. 2 illustrates a flowchart that details the operations performed in generating an AVF file, a DUT file, and a log file in accordance with one embodiment of the present invention.

FIG. 2 illustrates a flowchart 100 that details the operations performed in generating an AVF file, a DUT file, and a log file in accordance with one embodiment of the present invention. The method begins at an operation 102 where a chip design is provided for testing along with a netlist for the chip design. Also provided are testing parameters for the chip design, such as the file names for the chip design, the file name for the netlist, whether or not debugging information will be generated along with the file, instantiations for the chip and the I/O pads, the pin number for the power-on reset pin, etc.

Once these testing parameters have been provided in operation 102, the method will proceed to an operation 104 where a map file is provided for the chip design. As will be described below with reference to FIGS. 5A through 5C, the map file will identify a port/pin map list for each of the multiple port cells. Accordingly, for each multi-port cell, the instance for the cell, the ports for the cell, the enable information for the cell, and the pin numbers for the cell will be generated as an entry in the map file. Once a map file having a plurality of entries for each of the multi-port cells is provided, the method will proceed to an operation 106.

In operation 106, an AVF generator (avfgen) is provided, which is configured to be executed by using the information provided in operations 102 and 104. The method now proceeds to operation 108 where the AVF generator is executed to produce an "avf.v" file, which is a Verilog executable file. The avf.v file is then provided as part of a test bench for testing the target chip design. As shown, the test bench will generally include test files 110a, the avf.v file 110b, a netlist 110c for the chip design, and a set of models 110d. The test files 110a include information that details the wiring information for interconnecting the chip design to the set of models 110d. In addition, the test files 110a also include information that will detail the commands that are designed to stimulate the chip design under test and in accordance with the appropriate timing.

It should be noted that the avf.v file 110b is a generic file that will work with all of the tests provided in the test files 110a. Once the test bench has been established, the method will proceed to make the test bench information accessible to operation 112, where the test bench is executed to generate an AVF file 114, a DUT file 116, and a log file 118.

Figure 3:
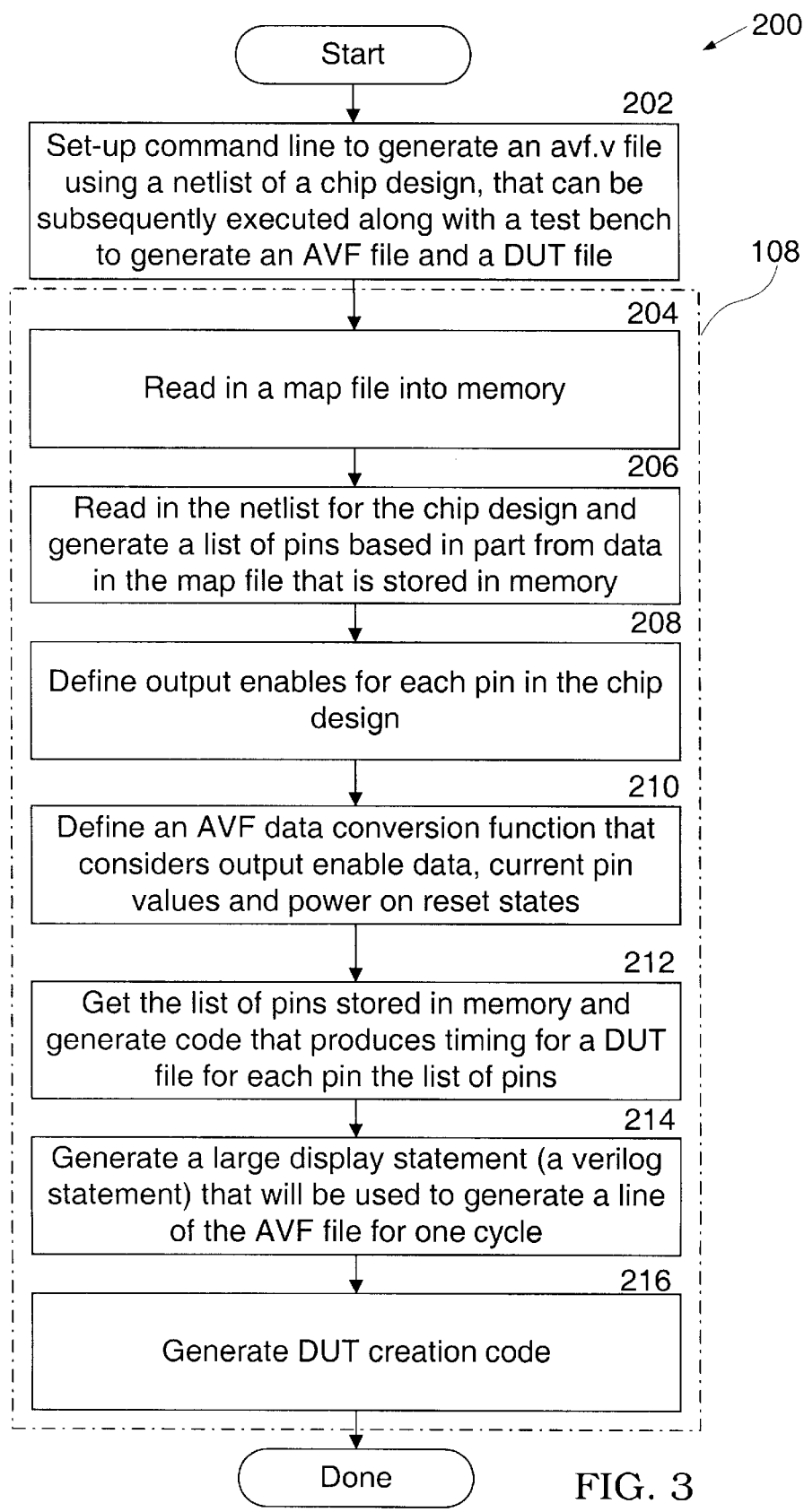
FIG. 3 illustrates a flowchart which illustrates the execution of the AVF generator (avfgen) that is configured to produce an avf.v file in accordance with one embodiment of the present invention.

FIG. 3 illustrates a flowchart 200 which illustrates the execution of the AVF generator that is configured to produce the avf.v file as described with reference to 108 of FIG. 2.

Initially, the method begins at an operation 202 where the command line is set up to generate an avf.v file using a netlist of the chip design. As mentioned above, the avf.v file can then be subsequently executed along with a test bench in order to generate the desired AVF file and the DUT file.

Figures 4B, 4C:
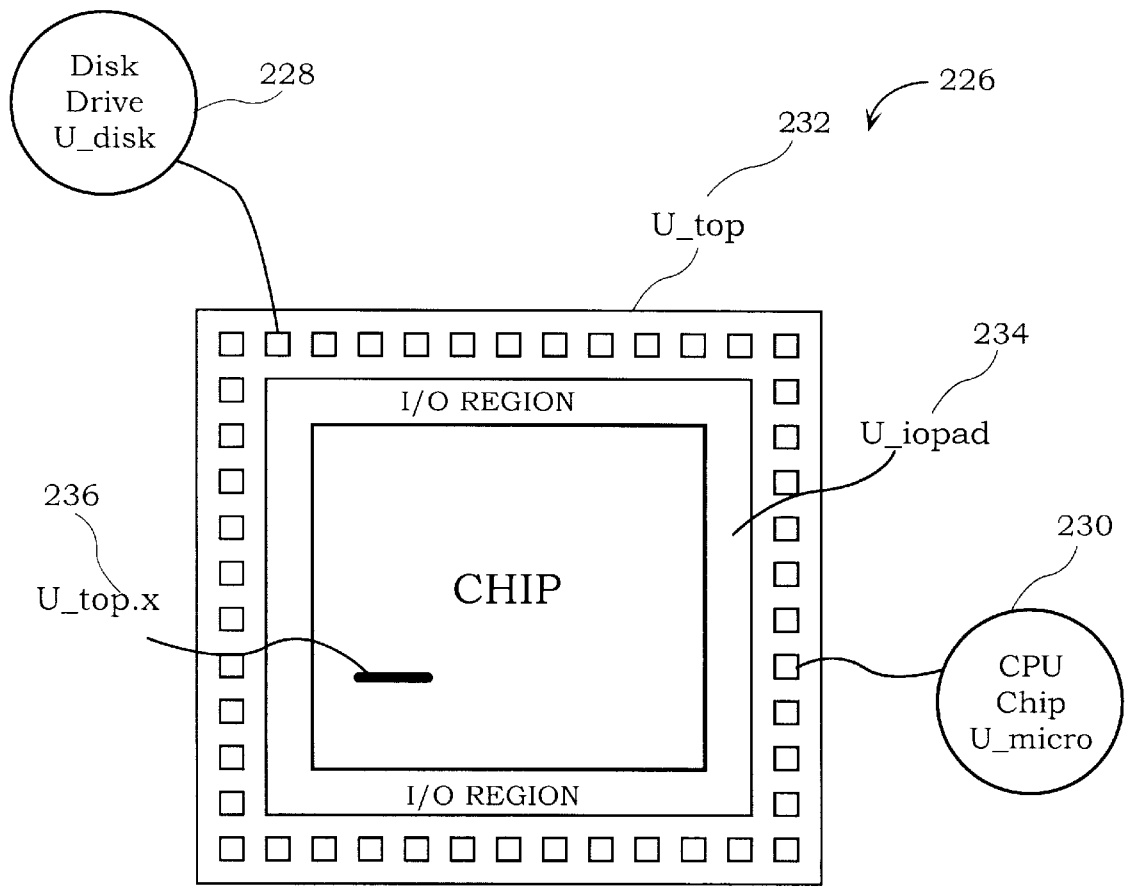
FIGS. 4B and 4C illustrate a more simplified example of a chip design and an associated command line entry in accordance with one embodiment of the present invention.

Setting up the command line generally entails typing in the correct data to enable running the AVF generator and a desired chip design, and its associated instantiations, map file, and netlist. FIG. 4A illustrates the typically commands that may be provided in a command line when it is desired to generate the avf.v file. As shown, a command line 202a is provided with a reference to avfgen and associated commands for running the AVF generator. The typical commands include, -V, -P, -0 FILENAME, -M FILENAME, -N FILENAME, -T TOP INSTANCE, -I IOPAD INSTANCE, and -R RESET PIN NUMBER. These identifying commands will therefore assist the AVF generator in producing the proper avf.v file for the desired chip design and associated netlist. FIGS. 4B and 4C illustrate a more simplified example of a chip design 226 and an associated command line entry. For example, the chip design 226 includes associated instantiations for u_top 232, u_iopad 234, and u_top.x 236. These example instantiations identify some characteristics for this simplified chip design 226. Accordingly, the command line entry referenced in 202a of FIG. 3 for the simplified chip design 226 would read as shown in FIG. 4C.

Referring once again to FIG. 3, once the setup of the command line is complete, the method will proceed to execute the AVF generator to produce the avf.v file in operation 108. The generation of the avf.v file begins at an operation 204 where a map file is read into memory for the desired chip design. Next, the method will proceed to an operation 206 where the netlist for the chip design is read in order to generate a list of pins based in part from data in the map file that is stored in memory. Once the list of pins have been generated in operation 206, the method will proceed to an operation 208 where output enables for each pin in the chip design are identified.

The method now proceeds to an operation 210 where an AVF data conversion function is defined that considers output enabled data, current pin values, and power-on reset states. Once the AVF data conversion function has been defined in operation 210, the method will proceed to an operation 212 where the list of pins stored in memory are retrieved to generate code that produces timing for a DUT file for each pin in the list of pins. The method now proceeds to an operation 214 where a large display statement (i.e., a Verilog statement) is produced to enable the generation of a line of the AVF file for a particular cycle. In general, generating a display statement includes, performing a function call (for each pin) to the AVF data conversion table (i.e., FIG. 7B), and then taking the result from the function call and placing it into the proper entry location in the AVF file.

After the large display statement has been produced in operation 214, the method proceeds to an operation 216 where a DUT creation code is generated. As will be described below, the DUT creation code is configured to produce the DUT file once the avf.v file produced in 108 is executed along with the test bench. Once the DUT creation code has been generated in operation 216, the method of flowchart 200 will be done. As described above with reference to FIG. 2, the avf.v file 110b and other test bench files may then be executed to generate the AVF file 114, the DUT file 116, and 10 the log file 118.

Accordingly, the avf.v file that is produced when the AVF generator is executed, may be used with any number of test files 110a and associated models 110b, in order to test the true functionality of the chip design under test. Reference may be made to Table B, which is an exemplary AVF file that may be generated once the test bench for a particular design is executed. Appendices B-1 through B-3 illustrates an exemplary DUT file 116 that may also be generated when the Verilog test bench executable files are executed.

FIG. 5A illustrates a flowchart 250 that identifies the method operations performed in generating a map file for a particular chip design in accordance with one embodiment of the present invention. The method begins at an operation 252 where cell types and their associated logical functionality are identified from the netlist of the chip design. Once the cell types and their associated logical functions have been identified, the method will proceed to an operation 254 where the method will proceed to a next multiple I/O cell in the netlist for the chip design.

Initially, the method will go to the first multiple I/O cell. Once at the first multiple I/O cell, the method will proceed to an operation 256 where the multiple I/O cell is formatted in an identifying statement. FIG. 5B illustrates one example of a multiple I/O cell that may be part of the chip design. In the example of FIG. 5B, an instance of an oscillator (u_OSC) is provided having a dataport 1 and a dataport 2. The multiple I/O oscillator is shown having a first pin and a second pin. The first pin is assigned pin number 34, and the second pin is assigned pin number 35. Dataport 1 of the first cell is shown having output enabled data .ned 1, and .neu 1. Dataport 2 is shown having output enabled data .ned 2 and .neu 1.

Therefore, for this exemplary multiple I/O cell of FIG. 5B, the identifying statement formatted in operation 256 is shown in FIG. 5C as 256'. This exemplary map file entry will therefore identify the oscillator as being a multiple I/O cell, which is part of the netlist. The method will now proceed to an operation 258 where it is determined if there is a next cell. If there is a next cell, the method will proceed to an operation 252 where the cell types and their associated logical functionality are identified. Now, the method will again proceed to operation 254 where the method will move to the next multiple I/O cell in the netlist for the chip design. Once the next multiple I/O cell in the netlist for the chip design is identified, it will be formatted in a proper identifying statement in operation 256. This method will therefore continue until there are no more multiple I/O cells in the netlist. At that point, the method of generating a map file 250 will be complete.

Figure 5D:
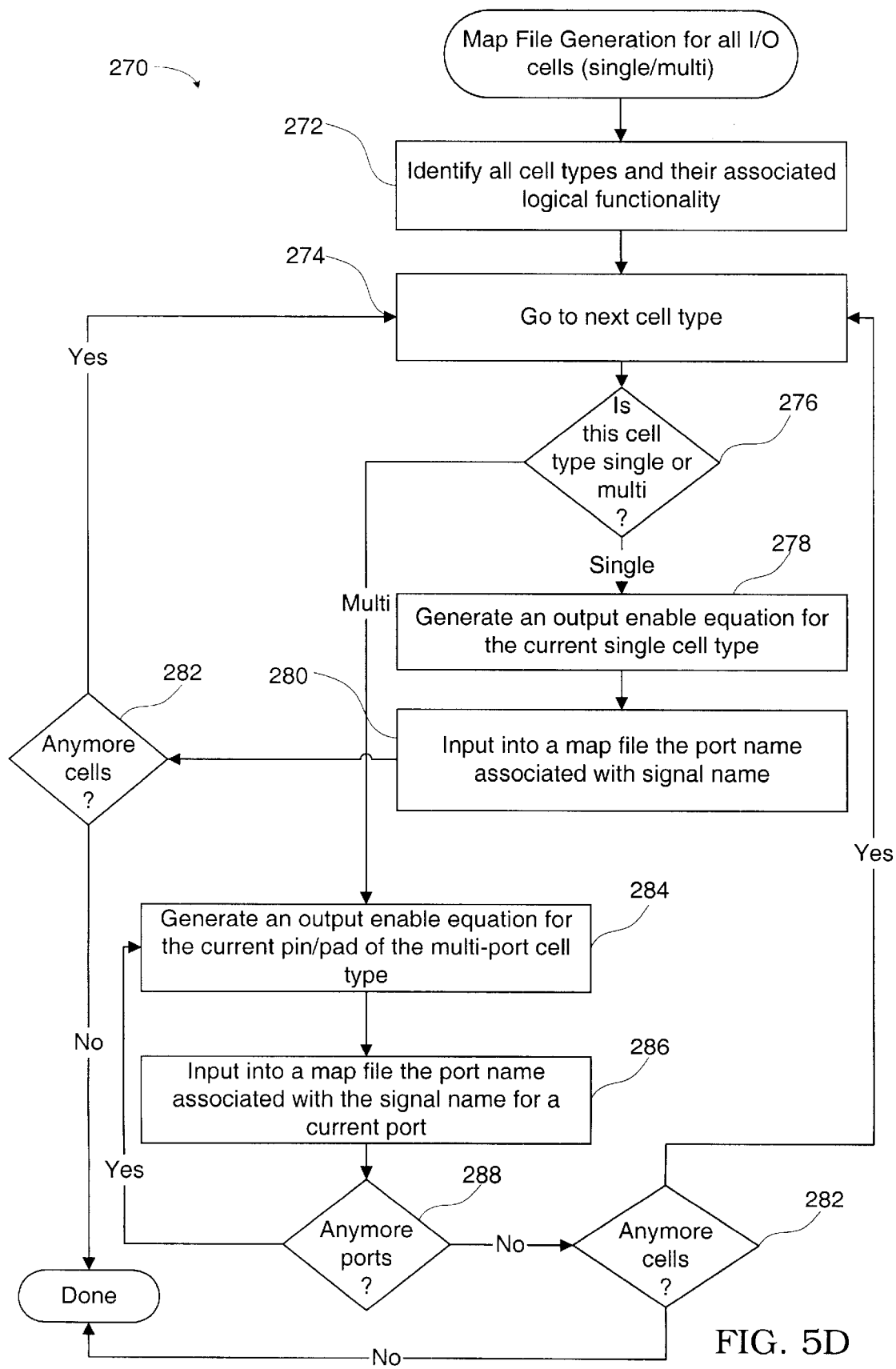
FIG. 5D illustrates the method of generating a map file for all I/O cells, including single and multi port cells, in accordance with one embodiment of the present invention.

FIG. 5D is a flowchart 270 illustrating the method operation performed in generating a map file for all I/O cells including single port cells and multi port cells, in accordance with one embodiment of the present invention. The method begins at an operation 272 where all cell types and their associated logical functionality are identified. Once all cell types have been identified, the method will proceed to an operation 274 where the method will proceed to a next cell type in the list of I/O cells. Initially, the method will begin with the first cell in the list of I/O cells. Then, the method will proceed to a decision operation 276 where it is determined whether the current cell is either a single port or a multi-port cell.

If the current cell is a single-port cell, the method will proceed to an operation 278 where an output-enable equation for the current single-port cell type is generated. Once the output-enable equation has been generated, the method will proceed to an operation 280 where the port name associated with the signal name is input into the map file. Specifically, this operation informs the program where to look for the signal name. This is needed because for each cell type, the signal name will be at a different port. Once operation 280 has been performed, the method will proceed to a decision operation 282 where it is determined whether there are anymore cells in the list of I/O cells. If there are no more cells, the method will be done. Alternatively, if there are more cells, the method will proceed back to operation 274.

Assuming now that the current cell in decision operation 276 is a multi-port cell, then the method will proceed to an operation 284. In operation 284, an output-enable equation will be generated for the current pin/pad of the multi-port cell type. Next, the method will proceed to an operation 286 where the port name associated with the signal name for a current port is input into the map file. Once the input has been performed for the current port, the method will proceed to a decision operation 288 where it is determined whether there are anymore ports in the current multi-port cell. If there are, operations 284 and 286 will be repeated for each port in the multi-port cell Once all ports have been completed for the multi-port cell, the method will proceed to decision operation 282 where it is determined if there are anymore cells in the list of I/O cells. If there are, the method will again proceed back up to operation 274 where the next cell type will be identified. Alternatively, if it is determined in operation 282 that there are no more cells in the I/O cell list, the method will be done.

An example of the map file entries for single port and multi-port cells is shown in Table A below. Specifically, an example for a single port cell and a multi-port cell have been provided, including the output-enable equations and the pin names.

TABLE A

Exemplary Map File Entries For Single/Multi Port Cells

| Cell Type | Single/Multi | Output-Enable Equation | Pin Name |
|---|---|---|---|
| Single port cell ioej08 | S | "{NED} && {MEU}" | {PAD}; |
| . | . | . | . |
| . | . | . | . |
| . | . | . | . |
| Multi port cell ioaj06 | M | "!{OEN} && {SESEL}" "!{OEN}" | {PADP} {PADM}; |
| . | . | . | . |
| . | . | . | . |
| . | . | . | . |

Figure 6A:
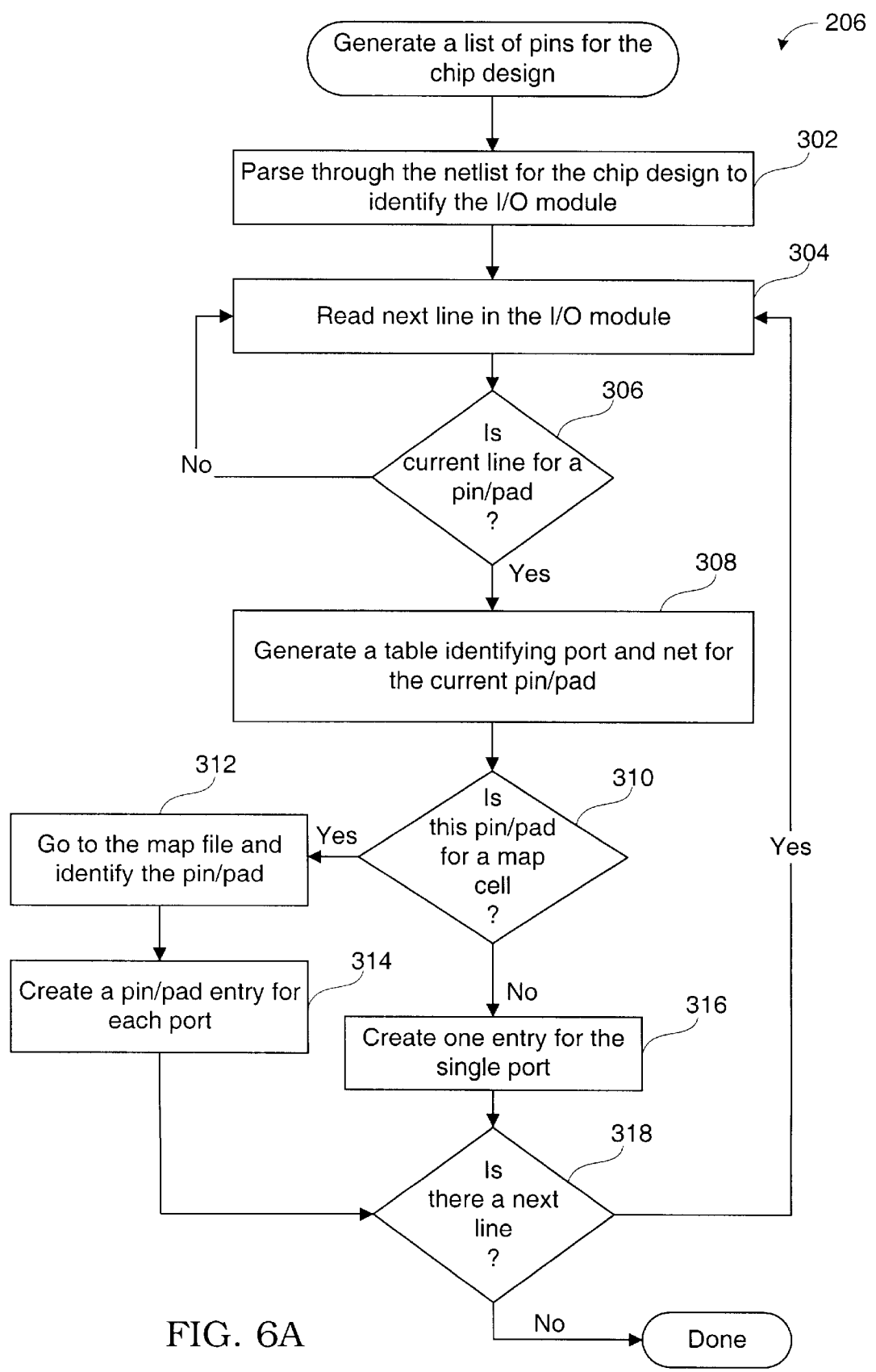
FIG. 6A illustrates an example of the method operations performed in generating a list of pins for the chip design in accordance with one embodiment of the present invention.

FIG. 6A illustrates an example of the method operations performed in generating a list of pins for the chip design in accordance with one embodiment of the present invention. Accordingly, flowchart 206 is a more detailed description of the method operations performed in operation 206 of FIG. 3. The method will begin at an operation 302 where parsing of the netlist of the chip design will be performed to identify the I/O module. FIG. 6B illustrates an example of a port/net table 302' of the netlist for the chip design that may be parsed through during operation 302. As shown, the exemplary table 302' identifies an instance, a cell type, a port and net for the enable information and the signal information, respectively. Once the I/O module has been identified in operation 302, the method will proceed to an operation 304 where the first line in the I/O module is read. Once the first line in the I/O module is read in operation 304, the method will proceed to a decision operation 306 where it is determined if the current line is for a pin or a pad (as used herein, the pin and pad terms are interchangeable).

Figure 6C:
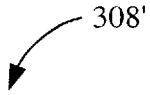

If it is not for a pin or a pad, then it is most likely some other type of logical gate. At that point, the method will proceed back to operation 304 where the next line in the I/O module is read. Once again, the method will proceed to decision operation 306 where it is determined if the current line is for a pin or a pad. When it is determined that it is for a pin or a pad, the method will proceed to an operation 308 where a table identifying port and net for the current pin or pad is generated. As shown in FIG. 6C, table 308' illustrates an example of the generated table for the port and net. The port will identify the output enable data (e.g., .neu, ned, etc.), and net data will identify the signal data (e.g., signal 1, signal 2, etc.). In this embodiment, the generated table 308' of FIG. 6C will be generated for each line in the I/O module, and then erased from memory. The data in FIG. 6C therefore corresponds to PAD001 in FIG. 6B where the appropriate port and net data is illustrated. When the next line in the I/O module is read, table 308' will be generated anew for the current line.

From operation 308 in FIG. 6A, the method will proceed to a decision operation 310 where it is determined if the current pin or pad is associated with a map cell. As mentioned above, map cells are cells that have multiple I/O ports. If the current pin is for a map cell, the method will proceed to an operation 312 where reference will be made to the map file and the pin or pad is identified.

Figure 6D:
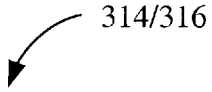

Once the pin or pad in the map file has been identified for the map cell, the method will proceed to an operation 314 where a pin or pad entry is created for each port. Reference is now drawn to FIG. 6D where an example of a port pin/pad entry table is provided. The entry table therefore identifies a port name, a pin or pad number, output enable data, and associated signals. For the exemplary multiple I/O cell of FIG. 5B, the port pin/pad entry table will have an entry for dataport 1, dataport 2, and its associated parameters. These entries will be made in operation 314 of FIG. 6A. On the other hand, if it is determined in operation 310 that the current pin or pad is not for a map cell, the method will proceed to an operation 316 where one entry for the single port is created. As an example, FIG. 6D illustrates a single entry for a pad having a pin or pad number 1 and its associated output enable data and signal data.

At this point, the method will proceed from either operation 314 or 316 to a decision operation 318. In decision operation 318, it is determined whether there is a next line in the I/O module. If there is, the method will proceed back to operation 304 where the next line in the I/O module is read. As mentioned above, an example of a simplified I/O module is shown in FIG. 6B. The method will then proceed filling-in the port pin or pad entry table of FIG. 6D until each line of the I/O module has been read and processed in FIG. 6A to generate a list of pins for the chip design.

Figure 7A:
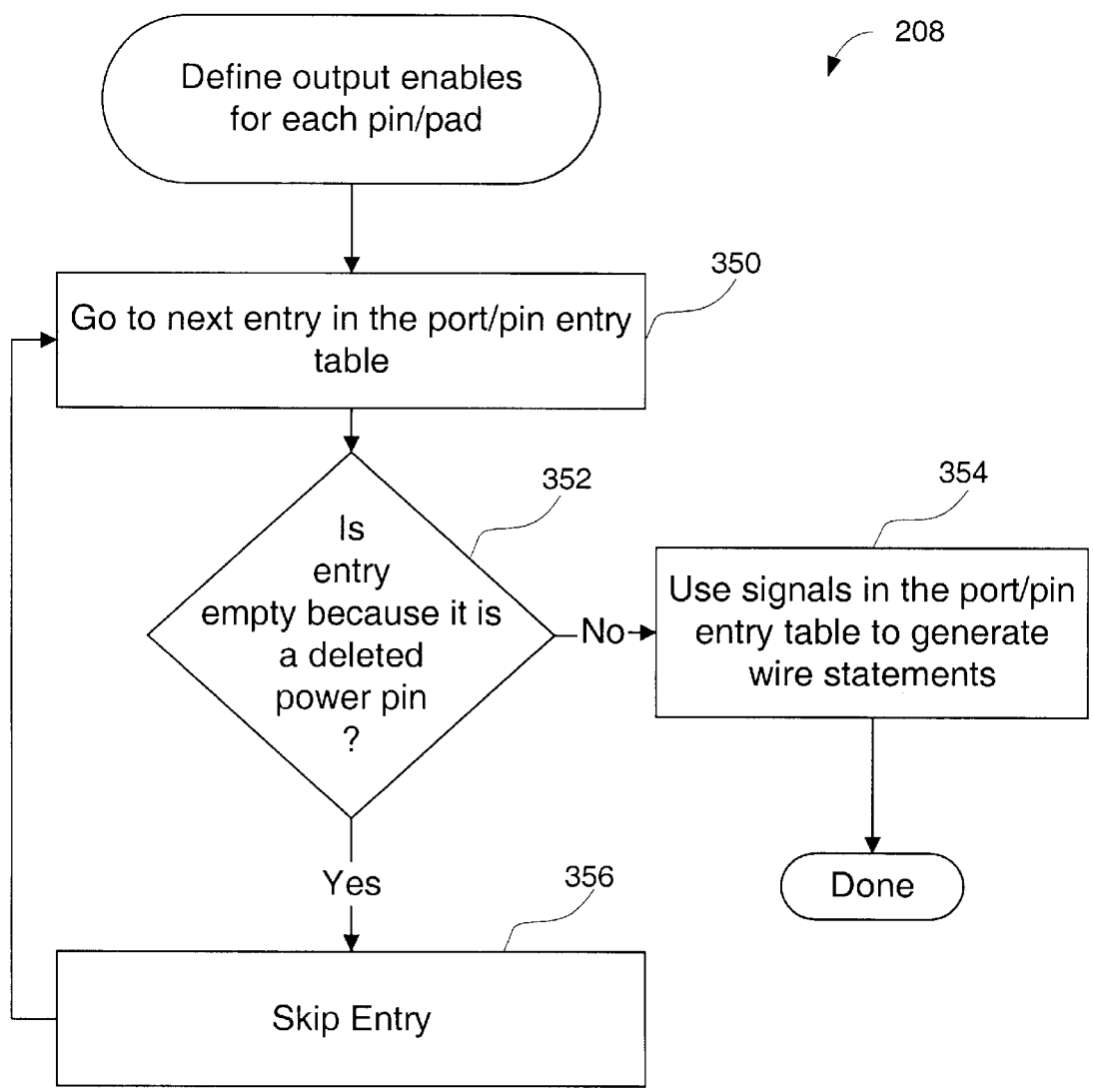
FIG. 7A illustrates a more detailed description of the sub-method operations of an operation of FIG. 3 where output enables are defined for each pin or pad in the chip design, in accordance with one embodiment of the present invention.

FIG. 7A illustrates a more detailed description of the method of operation 208 of FIG. 3 where output enables are defined for each pin or pad in the chip design. The method begins at an operation 350 where the method will go to a next entry in the pin or pad entry table of FIG. 6D, once it has been completed during the method operations of the flowchart of FIG. 6A. The method will now proceed to a decision operation 352 where it is determined whether the entry is empty because it is a deleted power pin. If it is a deleted power pin, the method will skip the entry in operation 356 and proceed back to operation 350. In operation 350, the method will go to the next entry in the port or pin entry table. Once it is determined that the next entry is not empty in operation 352, the method will proceed to an operation 354 where the signals in the port or pin entry table are used to generate wire statements. Exemplary wire statements, familiar to those skilled in the art are shown in Table D for completeness.

FIG. 7B illustrates an example of an AVF data conversion table which is defined in operation 210 of FIG. 3. As shown, the AVF data conversion table is used to determine what the AVF data is supposed to be depending upon the power-on reset information, the output enable information, and the value for each pin in a particular cycle.

Figure 8A:
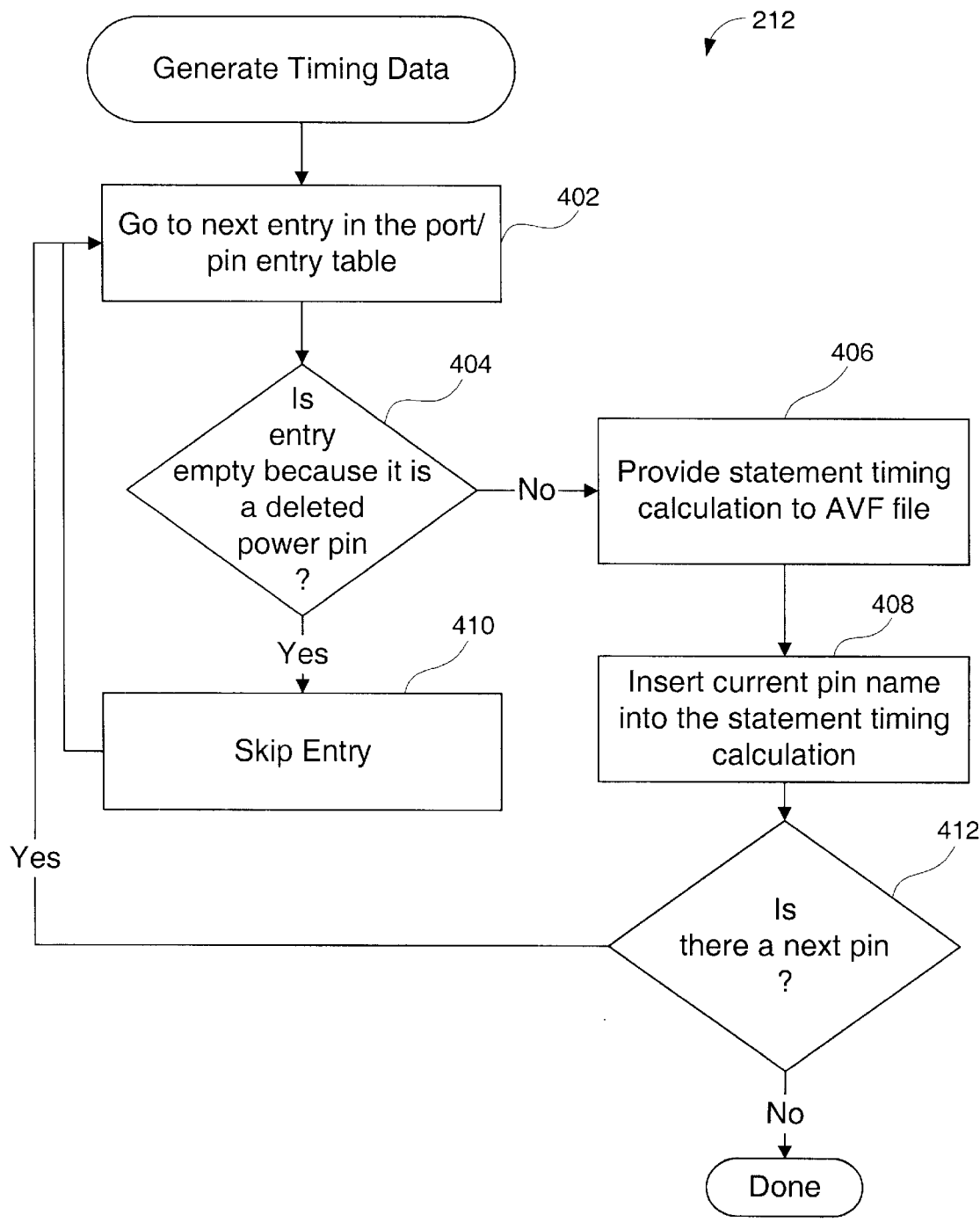
FIG. 8A illustrates the method operations performed when timing data is generated for the production of the DUT file in accordance with one embodiment of the present invention.

FIG. 8A illustrates the method operations performed when timing data is generated for the production of the DUT file. The method begins at an operation 402 where the method proceeds to the next entry in the port or pin entry table which was defined in FIG. 6D. In operation 404, it is determined whether the entry is empty because it is a deleted power pin. If it is a deleted power pin, the method will proceed to an operation 410 where the entry is skipped and the method will proceed back to operation 402. When it is determined that the current entry in the port or pin entry table is not deleted, the method will proceed to an operation 406 where a statement timing calculation is provided to the AVF file.

Next, the method will proceed to an operation 408 where the current pin name is inserted into the statement timing calculation. FIG. 8B provides an exemplary statement timing calculation in accordance with this embodiment. At this point, the method proceeds to a decision operation 412 where it is determined if there is a next pin in the entry table. If there is, the method will again proceed to operation 402. If there are no more pins in the entry table, the method will be done.

Figure 9:
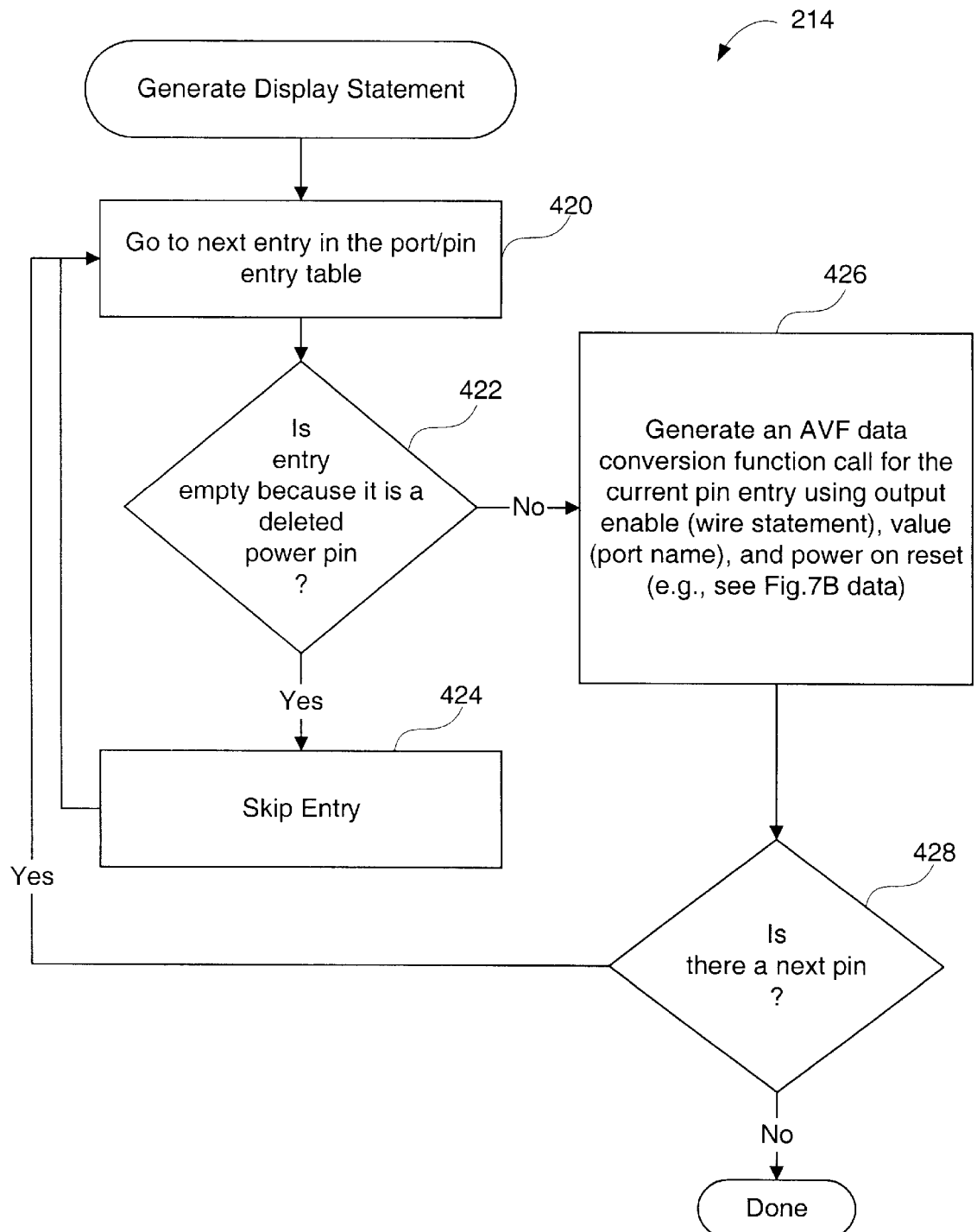
FIG. 9 illustrates a more detailed flowchart diagram of the method operations performed in FIG. 3 when generating a display statement in accordance with one embodiment of the present invention.

FIG. 9 illustrates a more detailed flowchart diagram of the method operations performed in 214 of FIG. 3 when generating a display statement in accordance with one embodiment of the present invention. The method begins at an operation 420 where the method moves to the next entry in the port/pin entry table. The method now moves to an operation 422 where it is determined if the entry is empty because it is a deleted power pin. If it is, the method proceeds to an operation 424 where the entry is skipped and the method moves to operation 420. Once it is determined that the entry is not empty because it was not a deleted power pin, the method will proceed to an operation 426.

In operation 426, an AVF data conversion function call is generated for the current pin entry using output enable data (wire statements), value data (port name), and power-on reset data. Reference should be made to the exemplary output enable data, value data, and power-on reset data provided in the table of FIG. 7B. The AVF data conversion function call is essentially the call that will generate AVF data similar to the AVF file illustrated in Table B, once the avf.v file along with the test bench (which are Verilog executables) are executed. Next, the method proceeds to an operation 428 where it is determined if there is a next pin. If there is a next pin, the method will proceed back to operation 420. From operation 420, the method will again proceed to decision operation 422 and then to skip the current entry 424 if the entry is empty because it is a deleted power pin. If it is not a deleted power pin, the method will again proceed to operation 426 and then back to operation 428. Once there are no more pins, the method will be done.

B. AVF Vector Data Verification Loop

Figure 10:
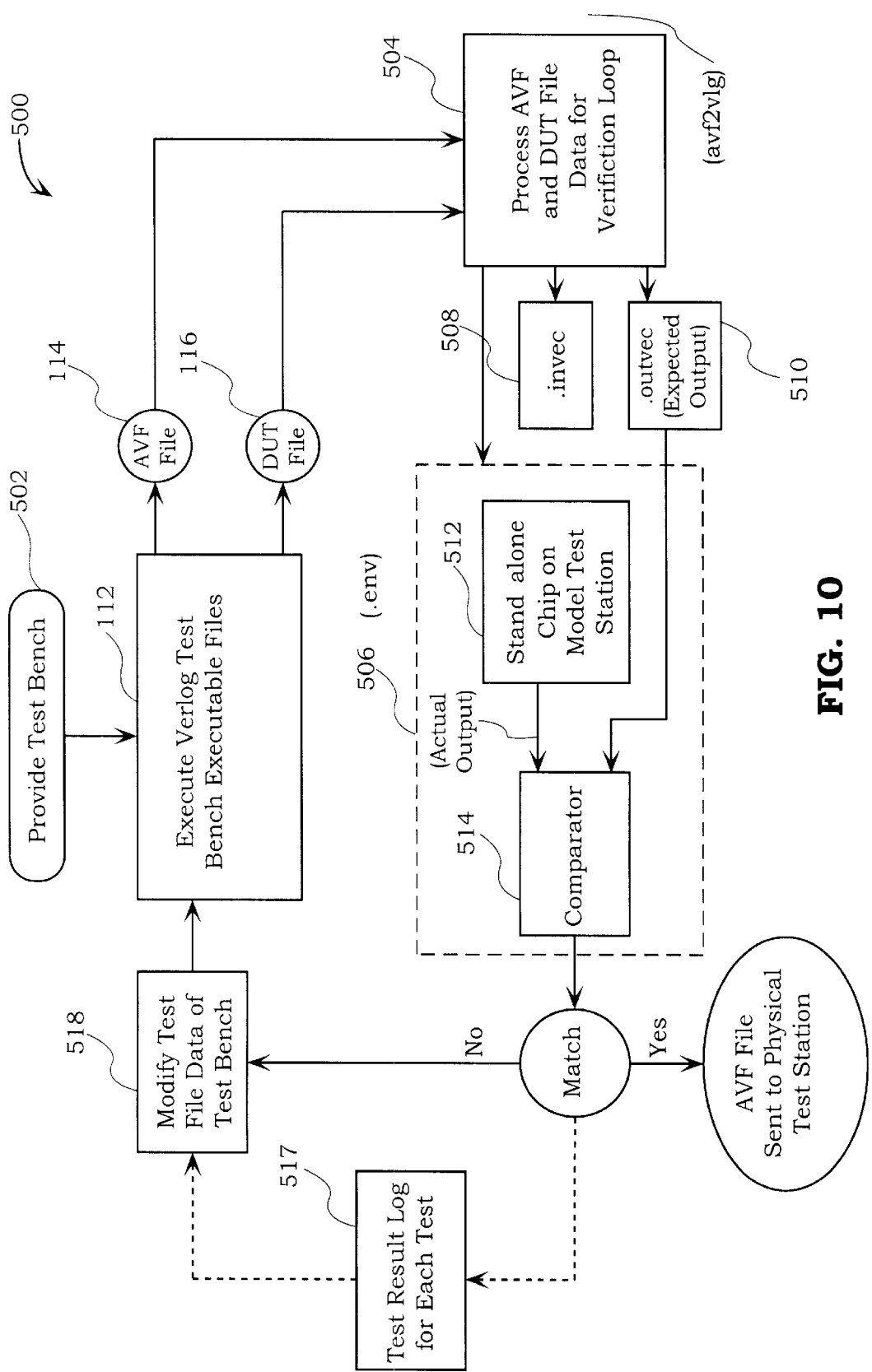
FIG. 10 illustrates a flowchart diagram of an AVF test vector verification loop in accordance with one embodiment of the present invention.

FIG. 10 illustrates a flowchart diagram of an AVF test vector verification loop 500 in accordance with one embodiment of the present invention. As discussed above, the verification loop is performed to substantiate the correctness of the generated AVF file data and the DUT file data that has just been generated. By executing this verification loop, the generated AVF file data and the DUT file data are used to generate input vector data and expected output vector data. The input vector data is then provided to a digital model of the test station having a model of the chip design under test. The input test vector is then feed to the model test station, which then generates an output that is compared with an expected output. If the output from the model test station matches the expected output, then the AVF file data and the DUT file data will be ready for use in the physical test station.

Reference is again made to FIG. 10, where the verification loop begins at an operation 502 and a test bench is provided. As discussed with reference to FIG. 2 above, the test bench typically includes the generated avf.v file 110*b*, test files 110*a*, the netlist for the chip design being tested 110*c*, and models 110*d*. Therefore, once the test bench is provided, the test bench files are executed in 112 to generate the AVF file 15 114 and the DUT file 116.

However, to ensure that the generated AVF file 114 and DUT file 116 are accurate once they are provided to the physical test station, they are processed through the verification loop. In this process, the AVF file 114 and the DUT file 116 are provided to a block 504 (e.g., avf2vlg) where the AVF file and the DUT file are processed for use in the verification loop. During the processing, input test data (.invec) 508, output test data (.outvec) 510, and an .env file 506 (e.g., which is an environment file) are produced. In general, the invec 508 is provided to the .env file 506 which has information about a model of a standalone chip which is simulated on a model test station 512. The .outvec 510 is essentially the expected outputs that should be generated once the .env file 506 is executed.

Once the .env 506 is executed, an actual output will be provided to a comparator 514. The .outvec 510, which is the expected output, is also provided to the comparator 514. If the expected output and the actual output match, then the AVF file is ready for use in the actual physical test station. However, if a match is not produced by the comparator 514, the loop will continue to a block 518 where the test file data of the test bench is modified to fix any timing errors that may have caused the "actual output"to not match the "expected output."

After the modification to the test file has been performed, the loop will again cause the test bench to be executed to generate another AVF file 114 and another DUT file 116. The AVF test vector verification loop 500 will therefore continue to be processed (if desired by the test engineer, because less than a perfect match may be acceptable in certain cases) until the comparator 514 determines that the actual output coming from the standalone chip on the model test station 512, matches the expected output from the .outvec 510. At that point, the AVF file should function properly with the actual physical test station hardware and properly test the integrity of the chip design being tested. In another embodiment, each time a test of the test files is run, the results of the verification are provided to a test result log 517 (which may be a long log of all of the run tests). In one embodiment of the present invention, a test engineer can examine the test result log 517 and determine if the verification loop should be run again after modifications are made to the test file data of the test bench.

It should also be noted that because the standalone chip on the model test station is actually a computer model of the test station, complete test coverage testing an also be performed during the model testing stage. As can be appreciated, this a substantial advance in the art.

Figure 11A:
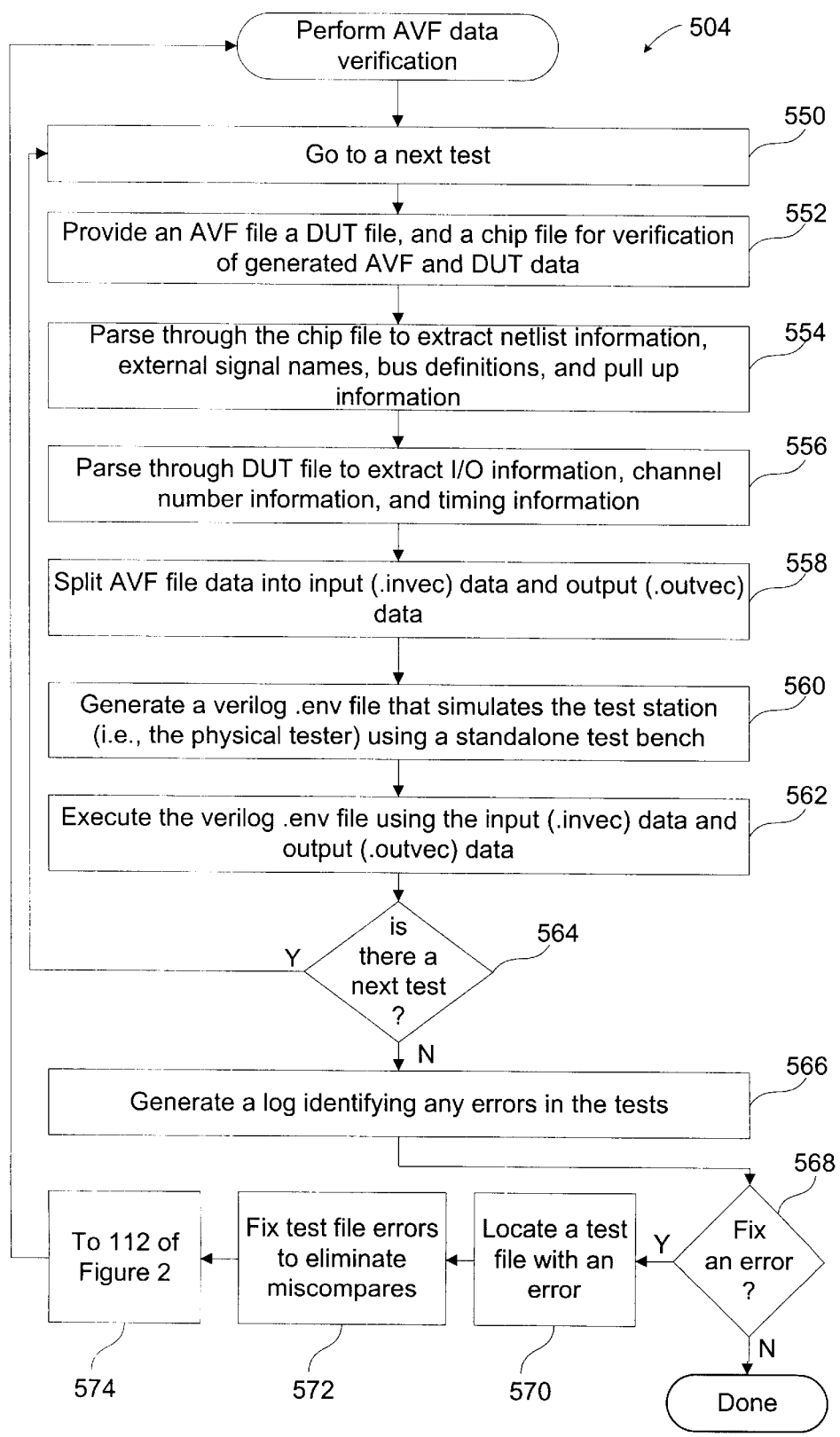
FIG. 11A illustrates a flowchart identifying the operations performed during AVF data verification in accordance with one embodiment of the present invention.
Figure 11B:
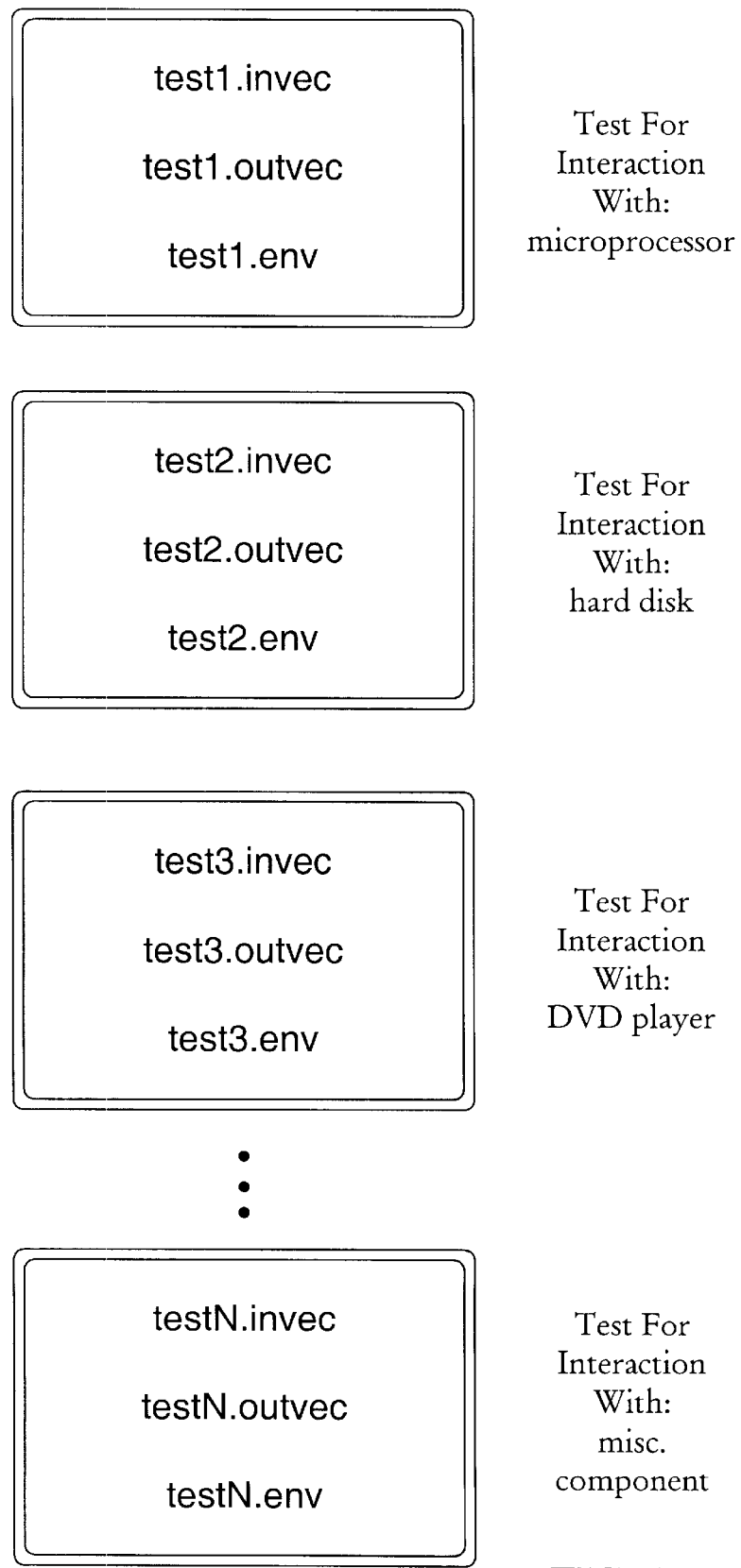
FIG. 11B illustrates pictorial examples of a multitude of tests that may be run as part of the test files in order to stimulate the chip design under test, in accordance with one embodiment of the present invention.

FIG. 11A illustrates a flowchart 504 identifying the operations performed during AVF data verification in accordance with one embodiment of the present invention. The method begins at an operation 550 where the method will go to a first test that is identified in the test files 110a in a particular test bench. Thus, FIG. 11B illustrates a plurality of tests which may be run during verification of the AVF data. For example, a first test may include a test 1.invec file, a test 1.outvec file, and a test 1.env file. The first test may be, for example, to test the interaction of the chip design with a given microprocessor. A second test may be to test the interaction of the chip design with a hard disk drive. A third test may be to test the chip design's interaction with a DVD player. Of course, the test files 110a may include many more tests in the range of hundreds or even many thousands of different tests to test the interaction of the chip design with its expected real world stimulation when the packaged chip is used for its intended purpose.

Reference is again drawn to FIG. 11A where the method continues in operation 552 where an AVF file and a DUT file is provided, and a chip file for the verification of generated AVF and DUT data is made available. Reference may be made to Table E which identifies an exemplary chip file. The chip file includes an identification of a netlist, pullup data, external signal names (e.g., chip wiring to external components), and bus declarations. Once the AVF file, the DUT file, and the chip file have been provided for verification in operation 552, the method will proceed to an operation 554. In operation 554, the method will parse through the chip file to extract netlist information, external signal name information, bus definition information, and pullup information.

Once the parsing through the chip file has been completed, the method will proceed to an operation 556 where a parsing through the DUT file to extract I/O information, channel member information, and timing information is performed. As mentioned above, an exemplary DUT file is shown in Appendices B-1 through B-3. The method then proceeds to an operation 558 where the AVF file data is split into input data (.invec), and output data (.outvec). After the AVF data has been split, the method will proceed to an operation 560 where a Verilog .env file is generated that simulates the test station (i.e., the physical tester) using a standalone test bench. The standalone test bench will basically include the netlist for the chip design being tested.

Next, the method will proceed to an operation 562 where the Verilog .env file is executed using the input data and the output data. With reference to FIG. 10, the .env file 506 is executed using the standalone chip on the model test station 512, including the comparator 514. Once executed, a determination is made as to whether the expected output matches the output from the standalone chip on the model test station. At this point, the method will proceed to a decision operation 564 where it is determined if there is a next test. As shown in FIG. 11B, there are typically many more tests that are run during the verification stage.

Accordingly, for the next test, the method will proceed back up to operation 550 where the method will go to the next test. Once it is determined that there are no more tests, a log is generated identifying any errors in the tests in operation 566. At this point, the test engineer can analyze the generated log to determine if any of the errors should be fixed in operation 568. If fixing the errors is desired, the method will proceed to an operation 570 where a test file having a particular error is located. Once the test file is located, the method will proceed to operation 572 where the test file errors are fixed to attempt to eliminate miscompares. Once the test file errors have been fixed, the method will proceed to operation 574 where the method will return to operation 112 of FIG. 2, where the test bench is executed. The execution of the test bench is also pictorially shown in FIG. 10.

At that point, a new AVF file and DUT file are generated, and verification of the AVF data can again be performed, if desired. Alternatively, if it is determined in operation 568 that there are no errors to fix, it will be assumed that the execution of the .env file produced actual outputs from the standalone chip on the model test station that matched the expected outputs. In that case, the method will be done. At the same time, if the errors are such that further verification is not desired, the method will also be done from the determination of operation 568.

Figure 12:
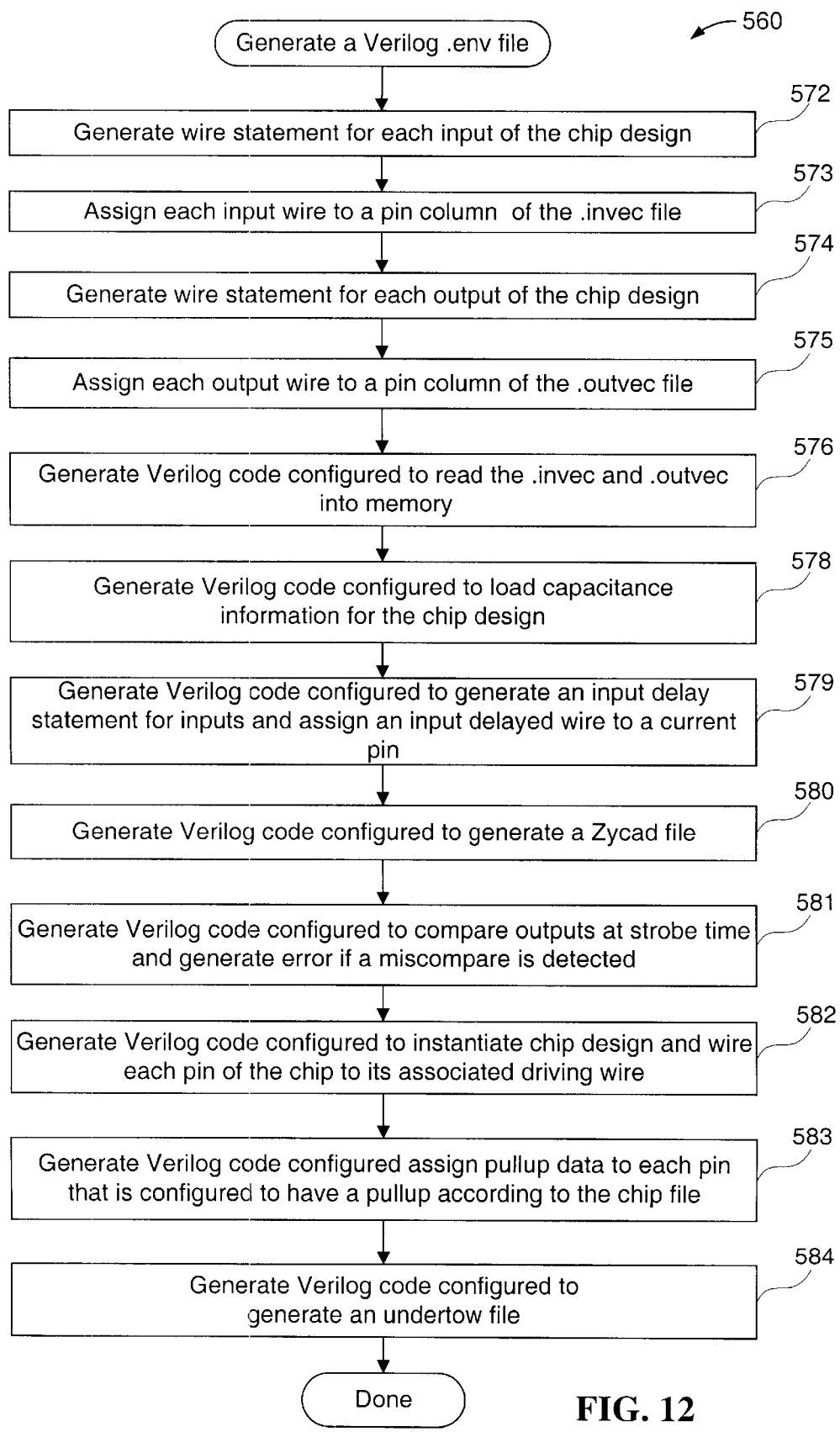
FIG. 12 illustrates a flowchart that describes the generation of a Verilog environment file that is subsequently executed in an operation of FIG. 11A, in accordance with one embodiment of the present invention.

FIG. 12 illustrates a flowchart 560 that describes the generation of a Verilog .env file that is subsequently executed in operation 562 of FIG. 11A. The method of generating a Verilog .env file begins at an operation 572 where wire statements for each input of the chip design are generated. Next, the method will move to an operation 573 where each input pin is assigned to a pin column of the .invec file. In general, the invec file is arranged in a memory array having columns for each pin in the chip design, and a row number for each cycle in a test. Next, the method will proceed to an operation 574 where wire statements for each output of the chip design is generated.

Once wire statements have been generated, the method will proceed to an operation 575 where each output wire is assigned to a pin column of the .outvec file. The method now proceeds to an operation 576 where Verilog code configured to read the invec and .outvec data into memory is generated. Once that set of code is generated, the method will proceed to an operation 578 where Verilog code configured to load capacitance information for the chip design is generated. As is well known, the chip wiring has particular capacitance for the various wires that should be approximated during the modeling of the chip design in order to approximate the actual true physical chip design circuit. Next, the method will proceed to an operation 579 where Verilog code configured to generate an input delay statement for inputs is generated. Verilog code is also generated to assign an input-delay wire to a current pin. An example of an input-delay wire is shown below.

wire #delay signalname_drv=signalname_input

Typical input-delay statements of the present invention can handle non-return to 0, return to 1, and return 0 statements. In the above example, each time the "signalname$_{13}$ input" changes, the "signalname—drv" will also change after a given "delay" that is specified in the input delay wire statement.

The method will then proceed to and operation 580 where Verilog code configured to generate a Zycad file is generated. The Zycad file is a fault creating file that applies inputs and can determine what amount of test coverage is achieved during a particular test. This test coverage testing will, therefore, closely if not identically, approximate the test coverage achieved in the true integrated circuit device being tested on the physical test station.

From operation 580, the method will proceed to an operation 581 where Verilog code configured to compare outputs at a strobe time and generate an error if a miscompare is detected, is generated. In this exemplary design, the strobe is set for 90 percent of a given cycle. Next, the method will proceed to an operation 582 where Verilog code configured to instantiate the chip design and wire each pin of the chip to its associated driving wire, is generated.

At this point, the method will proceed to an operation 583 where Verilog code will assign a pullup to each pin that is configured to have a pullup according to the chip file, is generated. Once the pullup information has been configured, the method will proceed to an operation 584 where Verilog code configured to generate an undertow file is generated. An undertow file is one that can be executed using a well known undertow program that enables computer graphical inspection of signals to facilitate debugging of errors. At this point, the method will be done. As mentioned above, the .env file generated in flowchart 560 is then subsequently executed along with the standalone chip on the model test station and the .invec data to determine whether the output produced from the standalone chip on the model test station will match the expected output (i.e., .outvec).

If a match is achieved, the AVF file data and the DUT file data will be considered to be appropriate for running on the physical test station. However, if the comparison determines that the actual outputs do not match the expected outputs, a test log will be generated for each of the files identifying where errors in comparisons were detected. At that point, the test engineer can decide whether further loops through the AVF test vector verification loop 500 of FIG. 10 should be executed in order to produce a suitable AVF file for use on the physical test station.

C. At-Speed Test Vector Conversion Process

In general, computer model testing typically assumes that the resulting physical integrated circuit design has ideal operating characteristics. Realistically, almost all integrated circuit designs, once fabricated into a physical part, will have performance varying characteristics. For example, the performance characteristics of a given integrated circuit design can vary due to variations in the silicon fabrication process as well as temperature changes. Thus, even though two integrated circuit design parts may be identically engineered to carry out the same particular functional application, their operating speeds may vary. Taking these variations into consideration is especially important for parts tested at high speeds such as, for example, 20 ns (50 MHz) cycle times. Accordingly, the present invention provides a method for generating a modified AVF test file that is configured to produce accurate test results for both slow and fast integrated circuit design parts.

Without this conversion, the computer model testing would produce test results which reflect numerous failures, when in fact, no failures should have been recorded. Of course, when failures are erroneously recorded, many hours of wasted trouble shooting time would have to be spent running tests on the physical integrated circuit part on the physical test station. Furthermore, wasted time on a physical test station is very costly since that occupies the tester machines which could otherwise be used to test other parts that are scheduled to be shipped to customers.

As a high level overview, the at-speed conversion process consists of two parts. The first part is the conversion process, and the second part is the pin-margining process. The conversion process converts the original test file (i.e., AVF test file) from a real-time model based simulation to a cycle based vector. The pin-margining process checks and identifies inputs and outputs that have marginal timings.

C.1. Conversion Process

The conversion process is broken down into three parts. The first part consists of generating a slow AVF test file, and verifying DUT timings. The second part involves generating a fast AVF test file based on the same vector inputs used to create the slow AVF test file. The third part combines the two AVF test files with the AVF post processor to create the final modified AVF test file.

Figure 13:
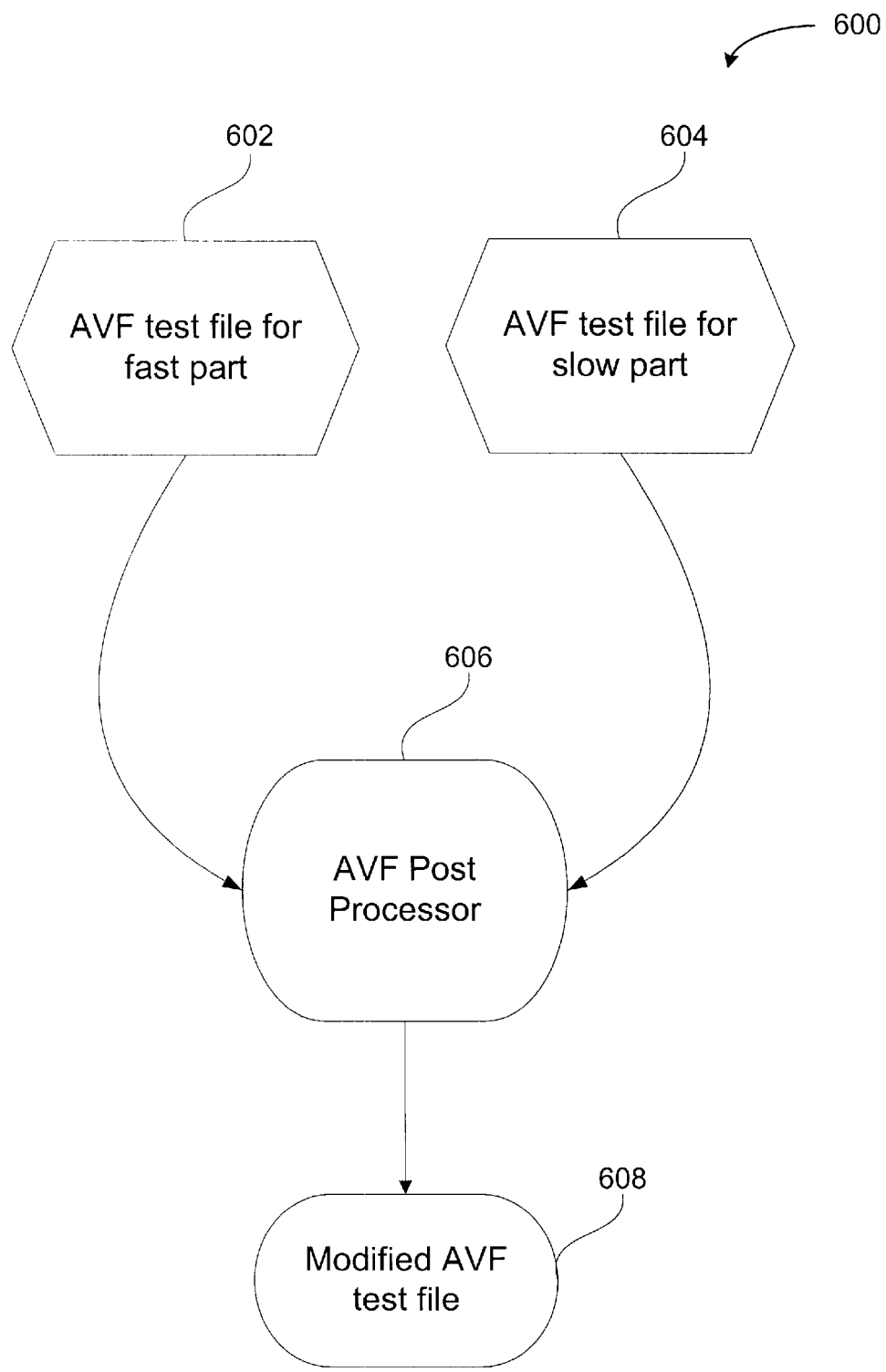
FIG. 13 illustrates an at-speed test vector conversion procedure used in testing integrated circuit designs that are computer models of a physical integrated circuit design, in accordance with one embodiment of the present invention.

FIG. 13 illustrates an at-speed test vector conversion procedure 600 used in testing integrated circuit designs that are computer models of a physical integrated circuit design, in accordance with one embodiment of the present invention. The at-speed test vector conversion procedure 600 is configured to implement an AVF test file for a slow version of the integrated circuit design and a fast version of the integrated circuit design. As mentioned above, the integrated circuit design is known to vary in speed depending upon silicon and temperature variations once the integrated circuit design is fabricated into a physical part. These considerations are thus built into the computer model testing methods of the present invention.

In fast integrated circuit designs, line capacitance and resistance is generally lower than that of a slower part which has higher line capacitance and resistance. The fast integrated circuit design will typically operate at a temperature that is cooler than that of the slower integrated circuit design. Accordingly, when the integrated circuit design is considered to be a fast part, signals will propagate faster regardless of clock speed. In a similar manner, the slower part will have signals that propagate slower regardless of the clock speed implemented in the integrated circuit design's operation.

Reference is again drawn to FIG. 13 where a pictorial illustration of an AVF test file for a fast part 602 and an AVF test file for a slow part 604 are communicated to an AVF post processor 606. The AVF post processor 606 of the present invention is configured to perform a comparison process between output signals of the AVF test file of the fast part 602, and the output signals of the AVF test file of the slow part 604 in order to determine where cycle slips occur. Upon detecting a cycle slip, the AVF post processor 606 is configured to replace the cycle slip data for the output signals with a value such as, "don't care".

By replacing cycle slips with don't care values, the AVF post processor 606 will be configured to generate a modified AVF test file 606 that guarantees that parts fall between the fastest expected timing and the slowest expected timing for their respective output signals. In other words, the testing performed on the computer models should generate a test vector (i.e., AVF test file) that will account for the actual expected characteristics of the physical part that is ultimately fabricated and tested on a physical test station. By generating a more precise AVF test file that takes into consideration the possible variations in silicon and temperature, the modified AVF test file will more likely produce results that resemble the actual physical integrated circuit design part. This modified AVF test file 608 will therefore prevent test data generated during the computer model testing from indicating that failures are expected to occur in the physical part, when in fact none should occur.

Figure 14A:
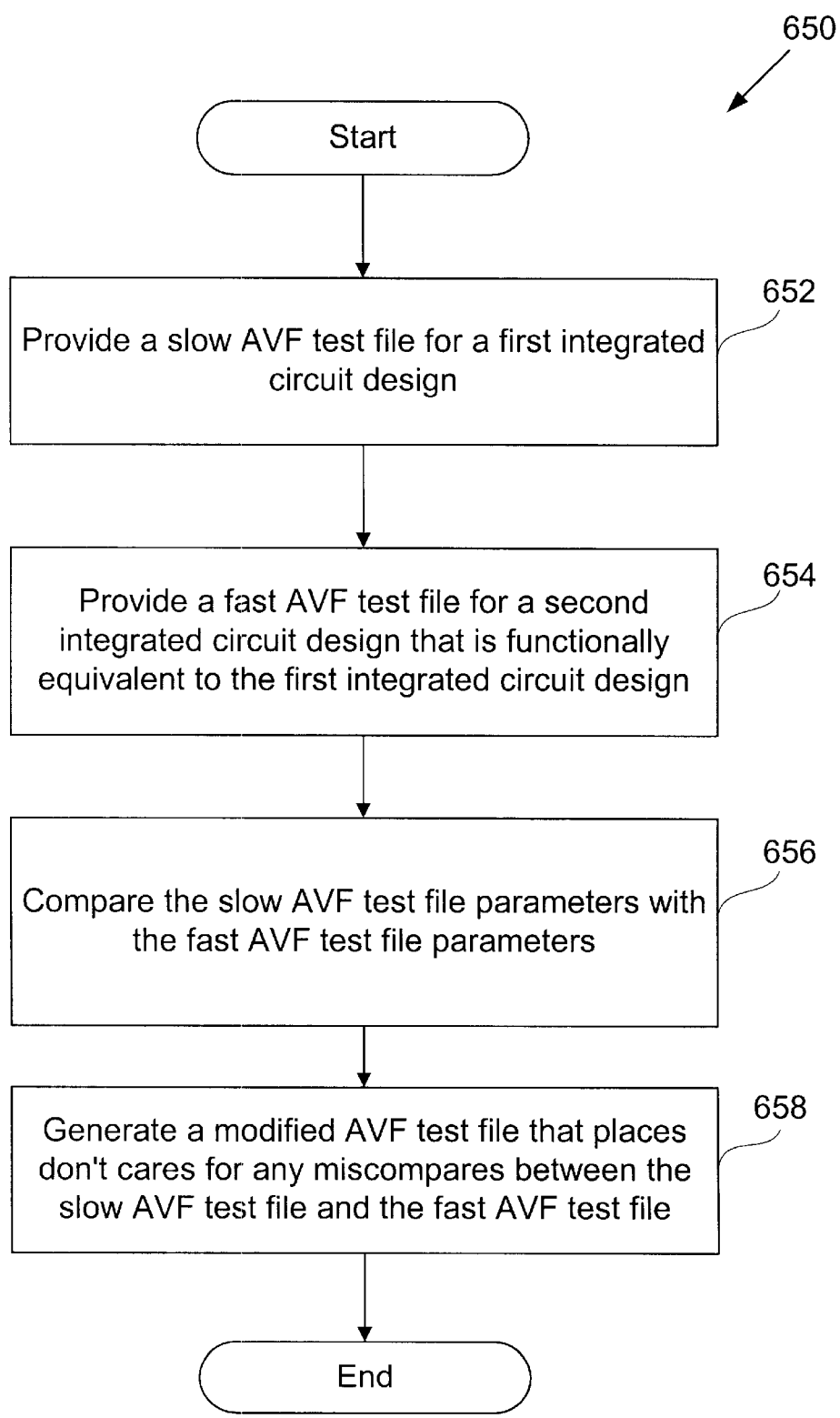
FIG. 14A illustrates a flowchart diagram that defines the method operations performed during an at-speed test procedure in accordance with one embodiment of the present invention.

FIG. 14A illustrates a flowchart diagram 650 that defines the method operations performed during an at-speed test procedure in accordance with one embodiment of the present invention. The method begins at an operation 652 where a slow AVF test file for a first integrated circuit design is provided. The slow AVF test file will generally include the particular parameters for capacitance and resistance for those various signals that make the integrated circuit design a slower part. Once the slow AVF test file has been provided in operation 652, the method will proceed to an operation 654.

In operation 654, a fast AVF test file for a second integrated circuit design is provided. The second integrated circuit design is functionally equivalent to the first integrated circuit design, however, it is associated with capacitance, resistance, and other parameters that define the integrated circuit design as a faster part relative to the slow part described in operation 652. Once the fast AVF test file has been provided in operation 654, the method will proceed to an operation 656. In operation 656, the slow AVF test file parameters are compared with the fast AVF test file parameters. As mentioned above, the parameters being compared will generally be the output signals of the relative parts. Once the comparing is complete, a modified AVF test file that has "don't cares" for any miscompares between the slow AVF test file and the fast AVF test file is generated. Once the modified AVF test file is generated, the method will end.

Figure 14B:
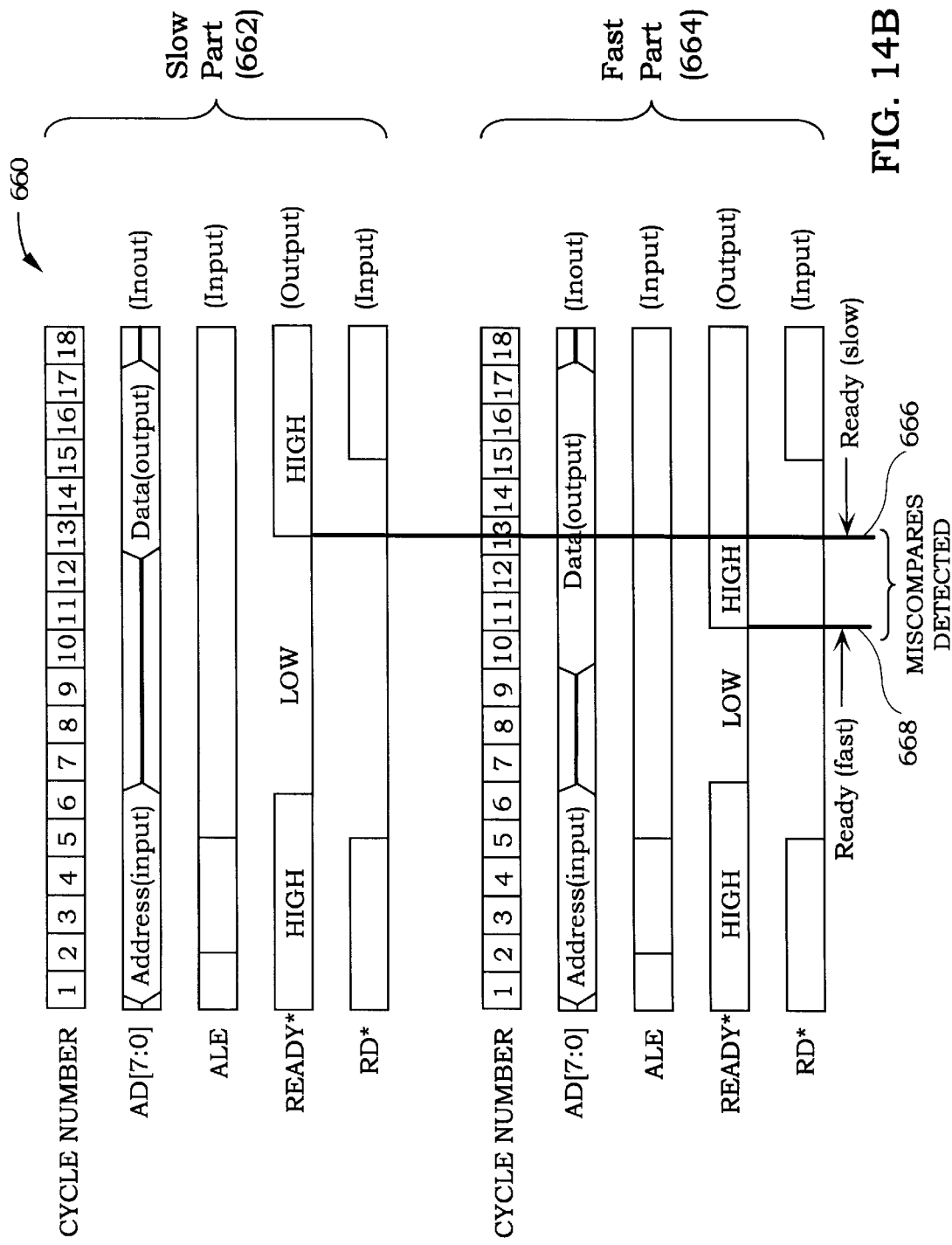
FIG. 14B provides a pictorial illustration of an AVF test file for a slow part and a fast part, in accordance with one embodiment of the present invention.

FIG. 14B provides a pictorial illustration 660 of an AVF test file for a slow part 662 and a fast part 664, in accordance with one embodiment of the present invention. The AVF test files are only representative test files that extend between cycle number 1 and cycle number 18. Each of the representative AVF test files will include an address line, an ALE line, a ready line, and a read data (RD) line, all of which are well known. In the slow part 662, the ready signal 666 for generating an output is shown to occur later in time after the ready signal 668 for the fast part 664.

More specifically, the fast part is shown to generate the ready signal 668 at about cycle number 10, while the slow part 662 generates the ready signal 666 at about cycle number 13. From this illustration, it is evident that the integrated circuit design will have timing variations that are dependent upon temperature and silicon variations. As such, the present invention performs a comparison operation between the output signals of the slow part 662 and the fast part 664, and places "don't care" values when the output signal of the slow part does not match the output signal level of the fast part. For instance, between cycle 10 and 13, the slow part will have an output signal level of low, and the fast part will have an output signal of high. At this point, a miscompare is detected for cycles between the ready signal 668 and the ready signal 666. At all other times after the ready signal 666 and before the ready signal 668, the output signal levels will match, and no other changes are made to the modified AVF test file.

FIG. 14C illustrates an speed-corrected modified AVF test file 670 after the comparison operations have been performed to generate the changes to the output signals. The modified AVF test file will therefore be capable of running on both a slow part and a fast part without generating output errors, because, such errors are not generally attributable to part failures. As shown, the new modified AVF test file will therefore be guaranteed for the fastest part 672, as well as for the slowest part 676, of an integrated circuit design. Between the guaranteed output timing of the fastest part and the slowest part, "don't care" values 674 are therefore shown inserted between cycle numbers 10 and 13.

Figure 15:
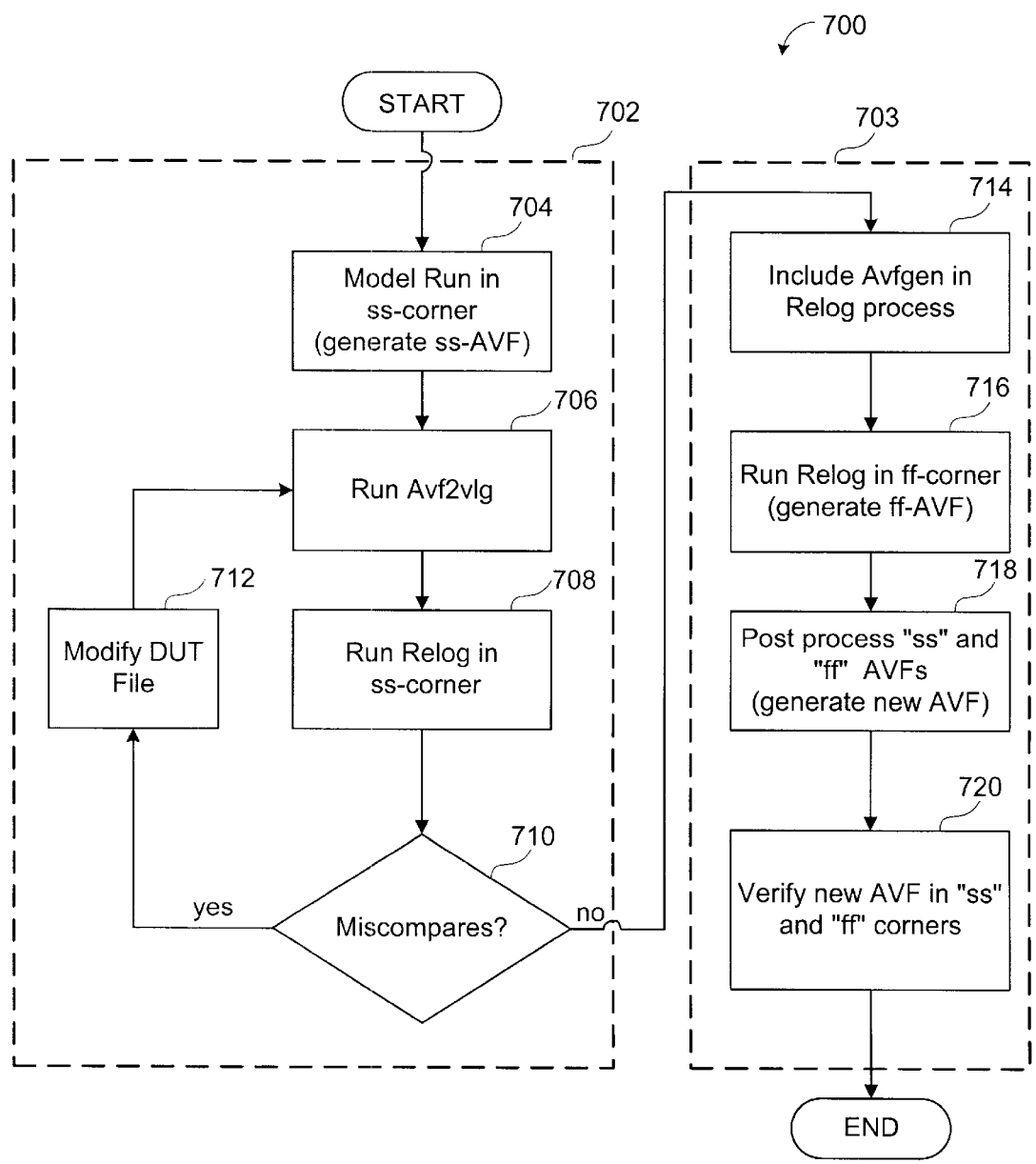
FIG. 15 illustrates a flowchart of the at-speed test vector conversion process, in accordance with another embodiment of the present invention.

FIG. 15 illustrates a flowchart of the at-speed test vector conversion process 700 in accordance with another embodiment of the present invention. The at-speed conversion process is divided into two parts. The first part, 702, includes a generation of an AVF test file for a slow part. The method of generating an AVF test file for a slow part begins in operation 704 where a model run in ss-comer is performed. As used herein, ss-corner refers to a slow part in terms of higher capacitance and resistance due to silicon variations and temperature variations. The model run in ss-corner therefore generates a slow AVF test file. Once the AVF test file and a DUT file is generated as described above with reference to FIG. 10, the method will proceed to an operation 706 where an avf2vlg run is performed. Once the avf2vlg is performed in operation 706, the method proceeds to an operation 708 where a relog run is performed in ss-comer. The relog run in ss-comer therefore represents a second Verilog run using an environment file, an invec and .outvec for the slow part.

The method now proceeds to a decision operation 710 where it is determined if here are any miscompares. If there is a miscompare, the method will proceed to an operation 712 where the DUT file (i.e., timing file) is modified. After the DUT file has been modified, the method will proceed back to operation 706 where the avf2vlg operation is again run. If it is determined in operation 710 that there are no more miscompares, the method will proceed to part two, 703, of the at-speed conversion process 700. Part two begins at an operation 714 where the AVFGEN method, discussed above in part A, is included in the relog process. In this step, the environment file of the slow part is modified, such that a new output vector (.outvec), will be generated while leaving the same input vector (.invec). A more detailed description of the inclusion of the AVFGEN in the relog process will be discussed with respect to FIG. 16 below.

At this point, the method will proceed to an operation 716 where the relog is run in an ff-comer mode in order to generate the fast AVF test file. As used herein, ff-corner refers to a fast integrated circuit design model. Once the relog run is performed in operation 716, the method will proceed to an operation 718 where an AVF post processor operation is performed between the ss and ff AVFs to generate the new modified AVF test file. As used herein, ss AVF refers to the slow AVF test file and the ff AVF refers to the fast AVF test file. Upon generating the new AVF test file in operation 718, the method will proceed to an operation 720 where the new modified AVF test file is verified on both the slow part and the fast part (i.e., the modified AVF test file is run on models of both parts). Once the verification has been completed, the method will end.

Figure 16:
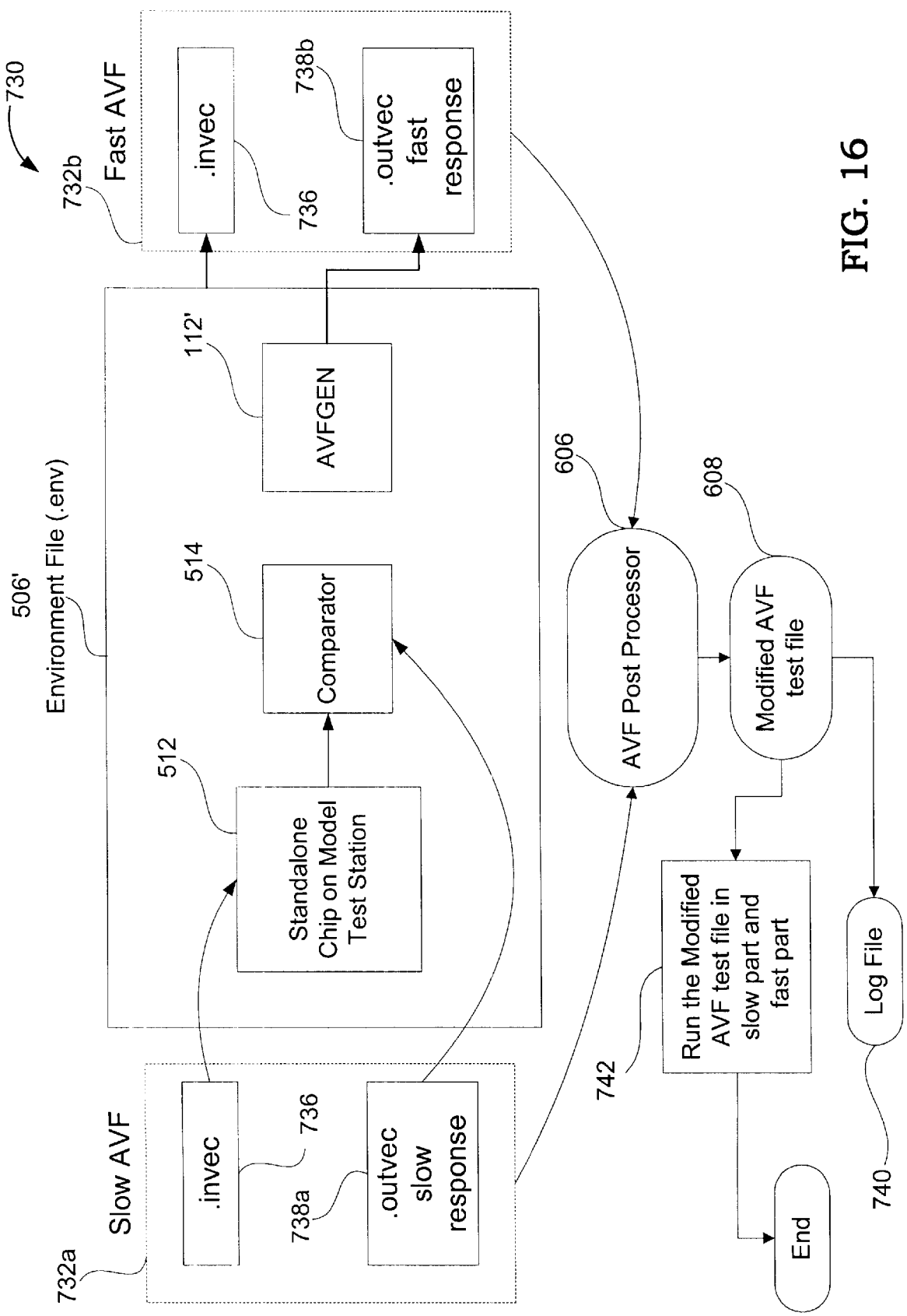
FIG. 16 shows an at-speed conversion block diagram in accordance with one embodiment of the present invention.

FIG. 16 shows an at-speed conversion block diagram in accordance with one embodiment of the present invention. As described above, a slow AVF 732a is first generated during part one, 702 of FIG. 15. Once the slow AVF has been generated, an .invec 736 and an .outvec slow response vector is communicated to an environment file .env) 506'. As shown, the invec 736 is first communicated to the standalone chip on model test station 512 as discussed above with reference to FIG. 10. The .outvec for the slow response 738a is communicated to the comparator 514 which is also discussed above with reference to FIG. 10.

In this embodiment, the environment file 506' is also provided with an AVFGEN that is configured to generate an .outvec for a fast response integrated circuit design. This is essentially done by modifying the timing information and setting a decreased capacitance value for the internal signals (e.g., as discussed with reference to 578 of FIG. 12). The fast AVF 732b will also include an invec 736 which is identical to the .invec for the slow AVF 732a. Once the slow AVF test file and the fast AVF test file are generated, they are provided to the AVF post processor 606 which performs the comparisons on the output signals to generate the modified AVF test file 608. The modified test file 608 is then run on the slow part and the fast part to ascertain whether miscompares are still detected.

During the generation of the modified AVF test file in operation 608, a log file is also generated. The log file provides the test engineer with a suitable amount of information in order to make determinations as to whether signal swallow conditions have occurred for certain critical signals as well as inhibit problems caused by IC wire length compensation performed by the physical tester. Once the modified AVF test files have been run on both the slow and the fast part in operation 742, the method will end.

C.2. Pin Margin Testing

Signal assertion with respect to time is not perfect due to physical tester-to-physical tester variation. From experimental testing, standard pin margin can be up to about 25% of a cycle time. For example, for a 20 ns cycle period, the test vectors need to allow for input signals to vary by as much as 5 ns. The pin-margining process, as will be described in more detail below, has three basic parts. The first part is input pin margining, where each input is moved by plus and minus about 2.5 ns and verified in Verilog for both a slow and a fast part. The second part involves moving the tester's strobe point by plus and minus 2.5 ns, and again verifying it in Verilog for both a slow and fast part. In the third part, the post processor creates a new modified AVF test file that is based on the original AVF test file and cycle-slip information recorded during the first two parts of the pin-margining process.

To gain better pin margin, the following should be taken into consideration:

(1) input inter-dependency

Knowledge of the design is important for understanding the effect of moving certain signals. The design can generally be broken down into various components; for example, host, disk, buffer, microprocessor, and ECC blocks. Each block has one or more associated clocks. In the case of a disk controller, the buffer clock controls buffer, host, and microprocessor blocks. The disk clock can affect the input signals in its associated blocks. In terms of fixing pin margin problems, understanding input inter-dependency can help the design and test engineers make better decisions when defining signal assertion within a cycle. The general approach for fixing pin margin problems includes: (a) always fix errors in input clocks (i.e., buffer clock, disk clock, etc.) first; (b) always reconvert the test when changing input clock timing; and (c) always recheck pin margin once input clocks have been fixed.

(2) Set majority of assertion times at 0 ns.

During the pin margining test for inputs, each input is moved by plus and minus 2.5 ns and verified in Verilog at each corner (i.e., for a slow and fast part). If an input is placed at 0 ns, it only needs to be moved by 2.5 ns. Since the physical tester does not check the previous cycle, the verification at -2.5 ns can be skipped. As such, time can be saved during the input pin margining test.

Figure 17:
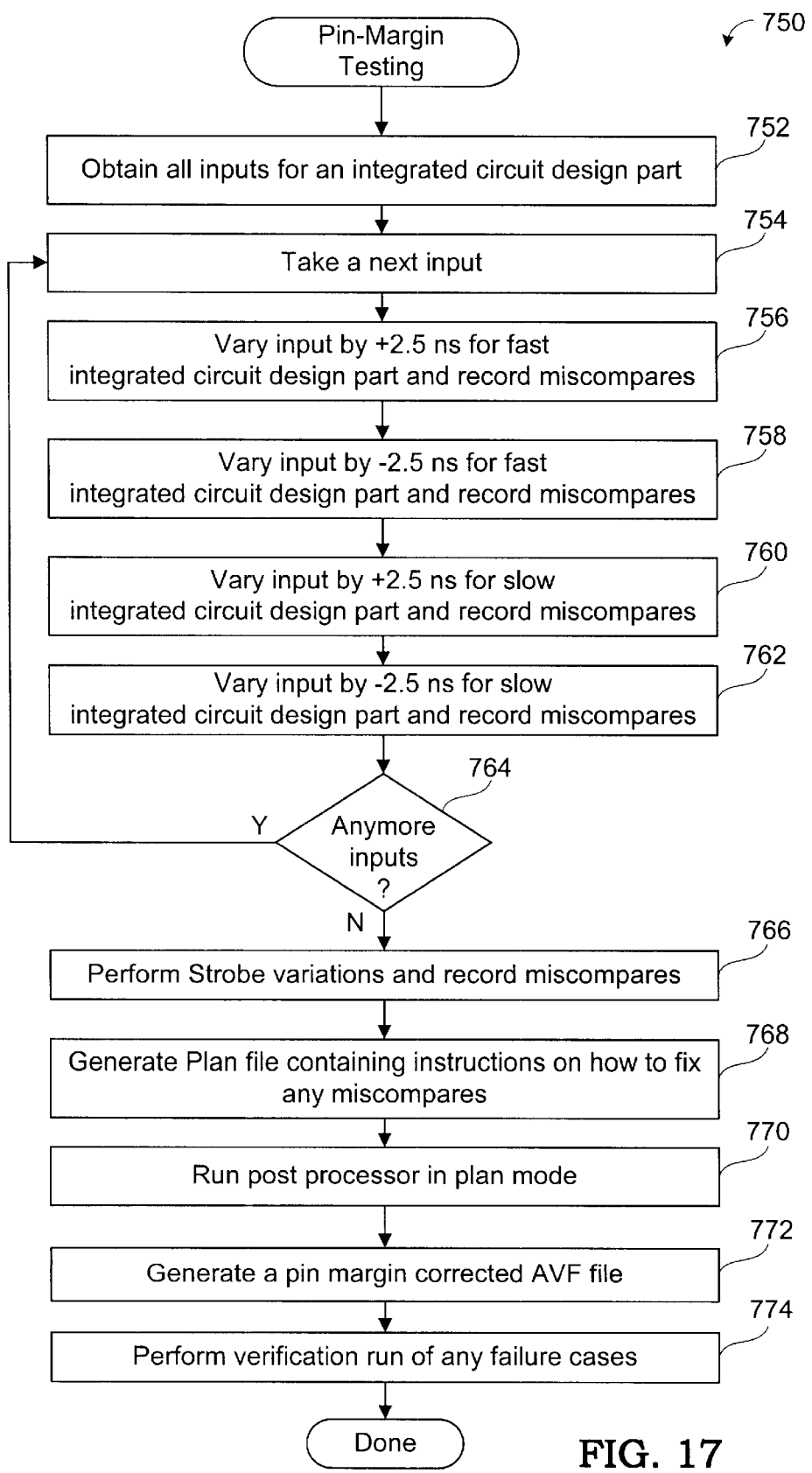
FIG. 17 illustrates a flowchart diagram of the method operations performed during pin margin testing in accordance with one embodiment of the present invention.

FIG. 17 illustrates a flowchart diagram 750 of the method operations performed during pin margin testing in accordance with one embodiment of the present invention. Pin margin testing is performed in order to compensate for known physical test station variations associated with signal assertion and output strobe times. As is well known, the physical test station can generate variations up to about 25 percent of a given cycle time. Accordingly, if an AVF test file is not adjusted for pin margin issues, the test results may erroneously indicate that failures occurred.

The pin margin testing process begins at an operation 752 where all inputs for an integrated circuit design part are obtained. In general, the input signals are obtained by identifying the input signals for the entire integrated circuit design. Once all input signals have been obtained, the method proceeds to an operation 754 where a next input is taken from the obtained inputs. Initially, the first input is taken. At this point, the current input is varied by +2.5 nanoseconds for the fast integrated circuit design part and any miscompares are recorded. The method now moves to operation 758 where the same input is varied by -2.5 nanoseconds for the fast integrated circuit design and any miscompares are also recorded. Now, the method moves to operation 760 where the input is varied by +2.5 nanoseconds for the slow integrated circuit design part and any miscompares are also recorded. After the input is varied by +2.5 nanoseconds, the method proceeds to an operation 762 where the input is varied by -2.5 nanoseconds for the same slow integrated circuit design part and any miscompares are recorded.

Although the method operations between 756 and 762 are shown as separate sequential operations, it should be understood that the present invention can also be batch processed (i.e., executed in parallel). The method will now proceed to decision operation 764 where it is determined if anymore inputs remain from the obtained inputs of operation 752.

If more inputs remain, the method will proceed to the next input in operation 754. At that time, that input will be varied for both the fast and the slow part by +2.5 nanoseconds and -2.5 nanoseconds. Once it is determined that all inputs have been adjusted and miscompares recorded for the obtained inputs of the integrated circuit design part, the method will proceed to an operation 766. In operation 766, strobe variations are performed and any miscompares are recorded. The variation of the strobe timing will be described in greater detail in FIG. 18 below. The method then proceeds to an operation 768 where a plan file containing instructions on how to fix any miscompares is generated. More specifically, the plan file is a post processor input file indicating which signals, edge types, and cycles to insert don't care terms in place of outputs. Once the plan file is generated, the method will proceed to an operation 770 where the AVF post processor is run in plan mode. Essentially, the post processor, when run in plan mode, is configured to generate a new corrected AVF file in operation 772 which takes into account the miscompares found during the variation of the input signals and the strobe timing. Once the pin margin corrected AVF file has been generated in operation 772, the method will proceed to an operation 774 where a verification run of any failure cases is performed.

Figure 18:
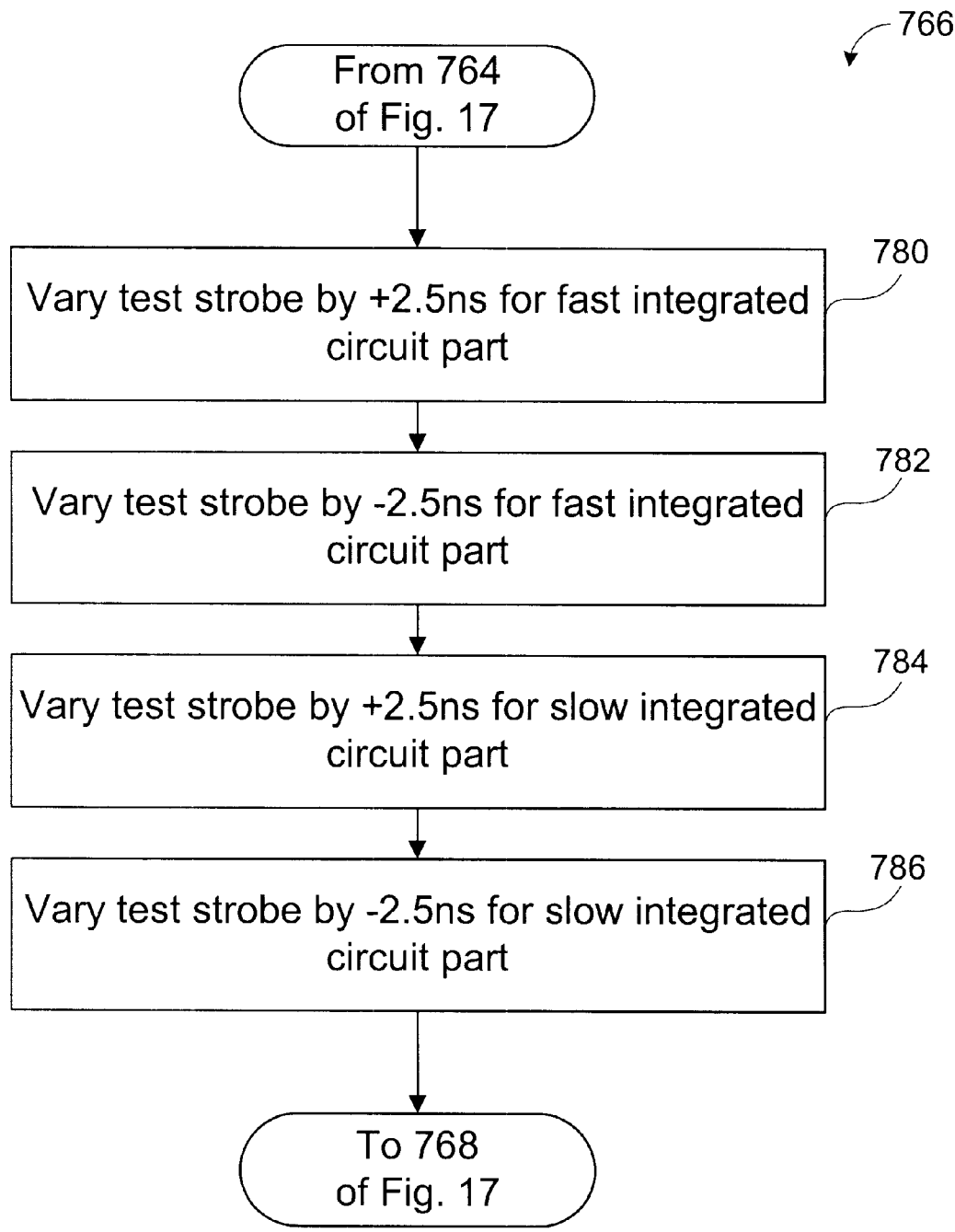
FIG. 18 illustrates a more detailed flowchart diagram of operation 766 of FIG. 17 in which strobe variations are performed and any miscompares are recorded, in accordance with one embodiment of the present invention.

FIG. 18 illustrates a more detailed flowchart diagram of operation 766 of FIG. 17 in which strobe variations are performed and any miscompares are recorded. The method begins from 764 of FIG. 17 and proceeds to an operation 780. In operation 780, the test strobe is varied by +2.5 nanoseconds for the fast integrated circuit part. Next, the test strobe is varied by -2.5 nanoseconds for the fast integrated circuit part. Once the variations are complete for the fast integrated circuit part, the test strobe is varied by +2.5 nanoseconds for the slow integrated circuit part in operation 784, and then the test strobe is varied by -2.5 nanoseconds for the slow integrated circuit part.

At each variation of the test strobe, any miscompares will be recorded. As mentioned above, the test vector strobe time variations can be batch processed to minimize execution time, thereby allowing each of the variations for both the fast and the slow integrated circuit part to be performed in parallel. The method will then proceed back to operation 768 of FIG. 17.

Figure 19:
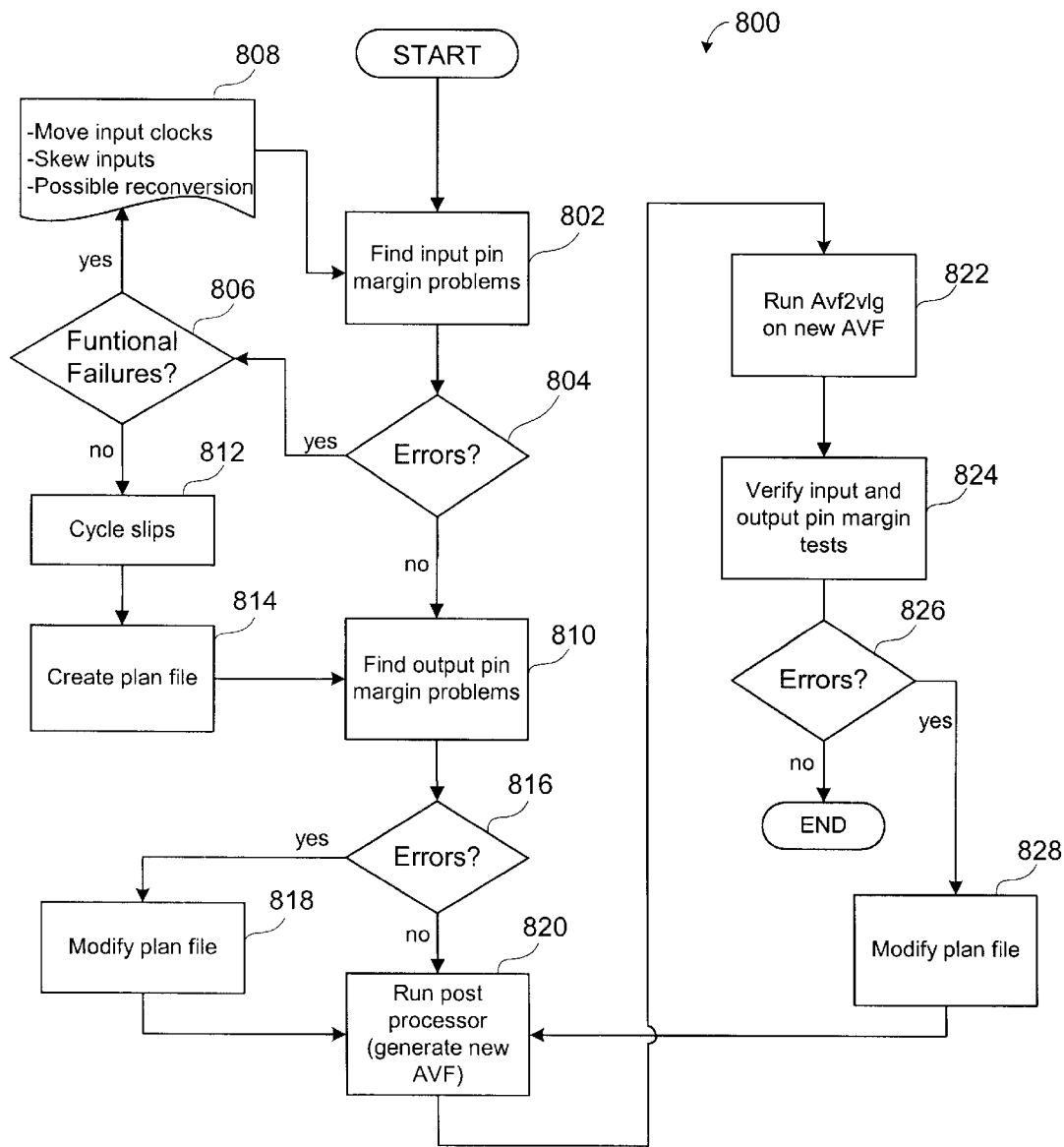
FIG. 19 is a flowchart illustrating method operations for performing pin margin testing in accordance with another embodiment of the present invention.

FIG. 19 is a flowchart 800 illustrating method operations for performing pin margin testing in accordance with another embodiment of the present invention. In this embodiment, the method begins at an operation 802 where input pin margin problems are found. In operation 804, it is determined if there are any errors with respect to the functional operation of the integrated circuit design or pin margin related problems. If it is determined that there are errors, the method will proceed to a decision operation 806 where it is determined if the errors are functional failures.

If the errors are functional failures, the method will proceed to an operation 808 where input clocks may be moved, inputs may be skewed, or the AVF test file may be re-converted from scratch. Once the appropriate fix is performed, the method will proceed back to operation 802 where input pin margin problems are found. If it is determined in operation 804 that errors were still found, and decision operation 806 determines that the errors were not functional in nature, the method will proceed to operation 812. In operation 812, it is determined that the errors are associated with cycle slips. At that point, the method will proceed to an operation 814 where a plan file is created having instructions on how to fix the cycle slips.

Now, the method will proceed to an operation 810 where output pin margin problems are found. It is now determined whether there are any errors after the output pin margin problems were found in decision operation 816. If there are errors, the method will proceed to operation 818 where the plan file is modified. Otherwise, the method will proceed to operation 820 where the post processor is run in order to generate a new AVF test file. After the new AVF test file is generated, the method will proceed to an operation 822 where the avf2vlg is run on the new AVF test file. Once the new AVF test file has been run through the avf2vlg verification, the method will proceed to an operation 824 where the input and output pin margin tests are verified. At this point, there should be no more errors related to pin margining.

However, if it is determined for some reason that there are errors at this point in operation 826, the method will proceed to operation 828 where the plan file is again modified, and the method will move to operation 820 where another run of the post processor is performed to generate a new modified AVF test file. However, if it was determined that no errors were present after operation 824, the method will end.

Figure 20:
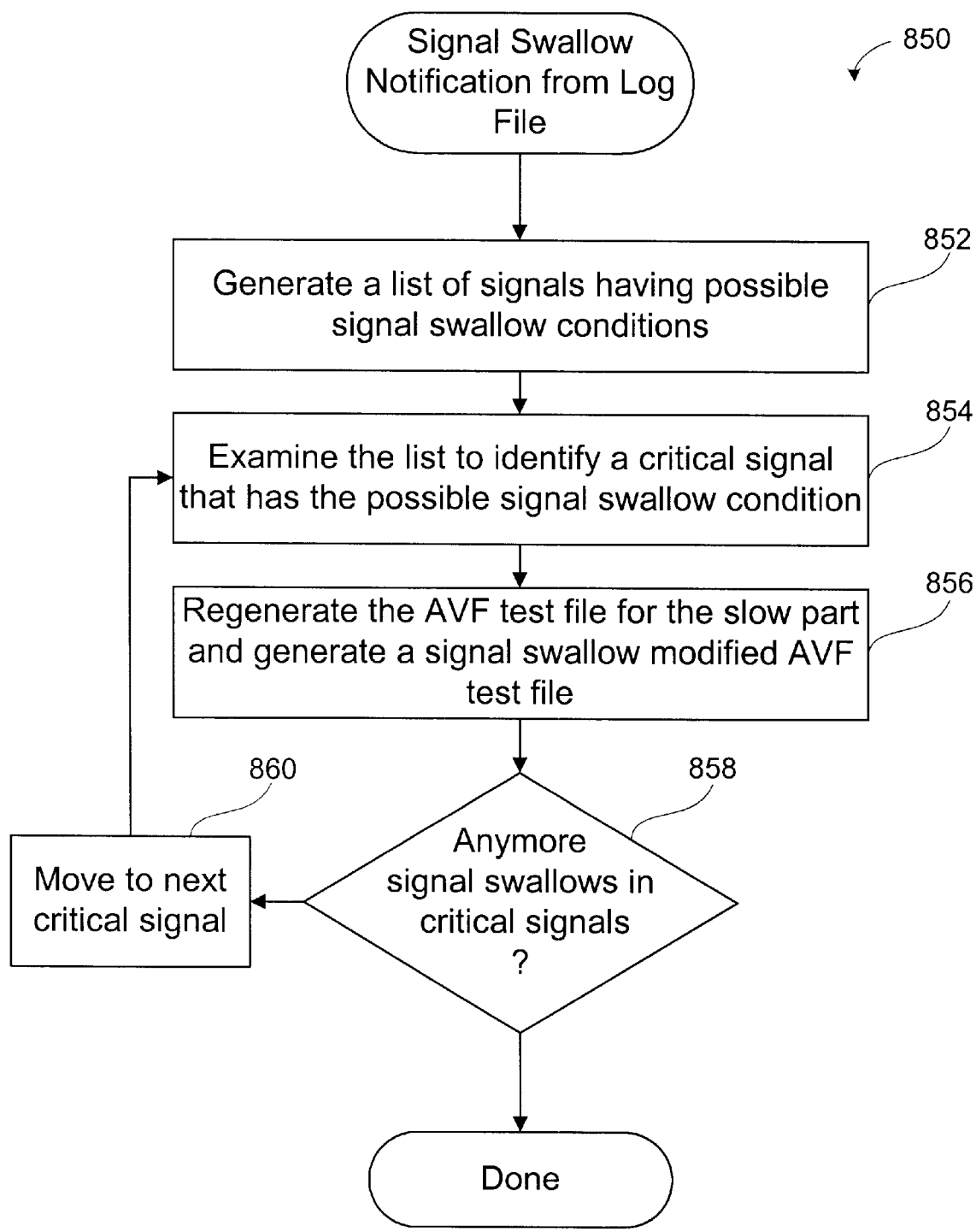
FIG. 20 illustrates a flowchart diagram identifying the method operation that may be performed during signal swallow investigations, in accordance with one embodiment of the present invention.

FIG. 20 illustrates a flowchart diagram 850 identifying the method operation that may be performed during signal swallow investigations, in accordance with one embodiment of the present invention. In this embodiment, signal swallow notifications are presented to the user in the form of a log file, which was discussed above with reference to FIG. 16. A signal swallow condition occurs when comparisons are made between the out signals of the fast integrated circuit design part and the slow integrated circuit design part. When such a comparison is made, there may be situations in which the occurrence of a subsequent slow transition will not be detected due to the insertion of the "don't care" values when generating the modified AVF test file.

To avoid such signal swallow conditions, the method begins at an operation 852 where a list of signals having possible signal swallow conditions is generated as part of the log file. Next, the list can be examined by the test engineer to identify a critical signal that has the possible signal swallow condition in operation 854. In operation 856, the AVF test file is re-generated for the slow part and a signal swallow modified AVF test file is generated. The method will then proceed to a decision operation 858 where it is determined if there are anymore signal swallows currently associated with critical signals. If there are, the method will proceed to an operation 860 where the engineer will move to the next critical signal 860, and then examine the list to identify the critical signal that has the possible signal swallow condition in operation 854. Once all critical signals have been examined, the method will be done.

The present invention may be implemented using any type of integrated circuit logic, state machines, or software driven computer-implemented operations as described above. By way of example, a hardware description language (HDL) based design and synthesis program may be used to design the silicon-level circuitry necessary to appropriately perform the data and control operations in accordance with one embodiment of the present invention. Although any suitable design tool may be used, a hardware description language "Verilog®" tool available from Cadence Design Systems, Inc. of Santa Clara, Calif., is used.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A computer implemented method for performing testing of a computer model of an integrated circuit design, comprising:

generating a first AVF test file for a first integrated circuit design having slow characteristics;

generating a second AVF test file for a second integrated circuit design having fast characteristics;

comparing test file parameters from the first AVF test file and the second AVF test file; and generating a modified AVF test file that takes into account the comparing of the test file parameters from the first test file and the second test file.

2. A computer implemented method for performing testing of a computer model of an integrated circuit design as recited in claim 1, further comprising:

running the modified AVF test file on the first integrated circuit design having slow characteristics.

3. A computer implemented method for performing testing of a computer model of an integrated circuit design as recited in claim 1, further comprising:

running the modified AVF test file on the second integrated circuit design having fast characteristics.

4. A computer implemented method for performing testing of a computer model of an integrated circuit design as recited in claim 1, wherein the slow characteristics are due to high capacitance parameters and high resistance parameters for the first integrated circuit design.

5. A computer implemented method for performing testing of a computer model of an integrated circuit design as recited in claim 1, wherein the fast characteristics are due to low capacitance parameters and low resistance parameters for the second integrated circuit design.

6. A computer implemented method for performing testing of a computer model of an integrated circuit design as recited in claim 4, wherein the high capacitance parameters and the high resistance parameters are associated to silicon variations of the first integrated circuit design.

7. A computer implemented method for performing testing of a computer model of an integrated circuit design as recited in claim 5, wherein the low capacitance parameters and the low resistance parameters are associated to silicon variations of the second integrated circuit design.

8. A computer implemented method for performing testing of a computer model of an integrated circuit design as recited in claim 1, further comprising:

generating a log file during the comparing of the test file parameters.

9. A computer implemented method for performing testing of a computer model of an integrated circuit design as recited in claim 8, further comprising:

providing inhibit notifications in the log file, the inhibit notifications are configured to alert problems associated with wire lengths of a physical integrated circuit chip that corresponds to either the first integrated circuit design or the second integrated circuit design.

10. A computer implemented method for performing testing of a computer model of an integrated circuit design as recited in claim 9, further comprising:

adjusting input timing of selected signals in order to correct timing problems that caused the inhibit notifications.

11. A computer implemented method for performing testing of a computer model of an integrated circuit design as recited in claim 9, further comprising:

performing pin margin testing on the first integrated circuit design and the second integrated circuit design; and correcting the modified AVF test file to compensate for pin margin errors.

12. A computer implemented method for performing testing of a computer model of an integrated circuit design as recited in claim 1, further comprising:

providing signal swallow notifications in the log file, the signal swallow notifications are configured to alert when particular signal compares between the first AVF test file and the second AVF test file may be undetected.

13. A computer implemented method for performing testing of a computer model of an integrated circuit design as recited in claim 12, further comprising:

examining the log file to ascertain which signal swallow notifications are associated with critical signals; and regenerating the slow AVF test file, the regeneration is configured to be performed after a modification of timing that caused the signal swallow notifications for the first integrated circuit design is complete.

14. A computer implemented method for performing pin margin testing of a computer model of an integrated circuit design that is tested on a computer model of a physical tester, comprising:

performing pin margin testing on a first integrated circuit design having slow characteristics and a second integrated circuit design having fast characteristics;

recording miscompares detected during the pin margin testing of the first integrated circuit design and the second integrated circuit design;

applying strobe timing variations to the computer model of the physical tester;

recording miscompares detected during the applying of the strobe timing variations;

generating a plan file that contains instructions on how to fix miscompares detected during the pin margin testing and the strobe timing variations; and running a post processor in a plan mode that is configured to generate a pin margining correct AVF test file.

15. A computer implemented method for performing pin margin testing of a computer model of an integrated circuit design that is tested on a computer model of a physical tester as recited in claim 14, further comprising:

performing a verification run of the pin margining corrected AVF test file.

16. A computer implemented method for performing pin margin testing of a computer model of an integrated circuit design that is tested on a computer model of a physical tester as recited in claim 15, wherein the verification run is configured to substantiate the correctness of the generated AVF file data and the DUT file data that was run on the post processor in the plan mode.

17. A computer implemented method for performing pin margin testing of a computer model of an integrated circuit design that is tested on a computer model of a physical tester as recited in claim 14, wherein the performing pin margin testing is configured to vary input signals by a predetermined amount.

18. A computer implemented method for performing pin margin testing of a computer model of an integrated circuit design that is tested on a computer model of a physical tester as recited in claim 17, wherein the predetermined amount is applied to the first integrated circuit design and the second integrated circuit design.

19. A computer implemented method for performing pin margin testing of a computer model of an integrated circuit design that is tested on a computer model of a physical tester as recited in claim 18, wherein the predetermined amount is +2.5 ns and −2.5 ns.

20. A computer readable media containing program instructions for performing testing of a computer model of an integrated circuit design, the computer readable media comprising:

program instructions for generating a first AVF test file for a first integrated circuit design having slow characteristics;

program instructions for generating a second AVF test file for a second integrated circuit design having fast characteristics;

program instructions for comparing test file parameters from the first AVF test file and the second AVF test file; and program instructions for generating a modified AVF test file that takes into account the comparing of the test file parameters from the first test file and the second test file.

21. A computer readable media containing program instructions for performing testing of a computer model of an integrated circuit design as recited in claim 20, further comprising:

program instructions for running the modified AVF test file on the first integrated circuit design having slow characteristics.

22. A computer readable media containing program instructions for performing testing of a computer model of an integrated circuit design as recited in claim 20, further comprising:

program instructions for running the modified AVF test file on the second integrated circuit design having fast characteristics.

* * * * *